(12) United States Patent
Chen et al.

(10) Patent No.: US 10,204,867 B1
(45) Date of Patent: Feb. 12, 2019

(54) SEMICONDUCTOR METROLOGY TARGET AND MANUFACTURING METHOD THEREOF

(71) Applicant: Taiwan Semiconductor Manufacturing Co., Ltd., Hsinchu (TW)

(72) Inventors: Long-Yi Chen, Changhua County (TW); Jia-Hong Chu, Hsinchu (TW); Hsin-Chin Lin, Yunlin County (TW); Hsiang-Yu Su, New Taipei (TW); Yun-Heng Tseng, Hsinchu County (TW); Kai-Hsiung Chen, New Taipei (TW); Yu-Ching Wang, Tainan (TW); Po-Chung Cheng, Zhongpu Township, Chiayi County (TW); Kuei-Shun Chen, Hsinchu (TW); Chi-Kang CHang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 9 days.

(21) Appl. No.: 15/692,151

(22) Filed: Aug. 31, 2017

(51) Int. Cl.
*H01L 23/544* (2006.01)
*H01L 21/66* (2006.01)
*G03F 7/20* (2006.01)

(52) U.S. Cl.
CPC ........ *H01L 23/544* (2013.01); *G03F 7/70633* (2013.01); *H01L 22/12* (2013.01)

(58) Field of Classification Search
CPC .. G01N 21/93; G01N 21/956; G03F 7/70616; G03F 7/70625; G03F 7/70633; G03F 7/70641; G03F 7/70683; G01B 11/02; G01B 11/022; G01B 11/024; G01B 11/14; H01L 23/544; H01L 22/12
See application file for complete search history.

(56) References Cited

U.S. PATENT DOCUMENTS

| | | |
|---|---|---|
| 8,716,841 B1 | 5/2014 | Chang et al. |
| 8,736,084 B2 | 5/2014 | Cheng et al. |
| 8,796,666 B1 | 8/2014 | Huang et al. |
| 8,837,810 B2 | 9/2014 | Chen et al. |
| 9,093,530 B2 | 4/2015 | Huang et al. |
| 9,134,633 B2 | 9/2015 | Lin et al. |
| 9,230,867 B2 | 1/2016 | Chang et al. |
| 9,304,403 B2 | 4/2016 | Lin et al. |

(Continued)

*Primary Examiner* — Gordon J Stock, Jr.
(74) *Attorney, Agent, or Firm* — McClure, Qualey & Rodack, LLP

(57) ABSTRACT

A metrology target of a semiconductor device is provided. The metrology target includes a substrate including first and second layers. The first layer includes a first grating, a second grating, and a first dummy structure. The first dummy structure is at least formed between the first grating and the second grating. The second layer is formed over the first layer and includes a third grating and a fourth grating. The first, second, third and fourth gratings are formed based on the first spatial period. The third grating and fourth grating are placed to overlap the first grating and second grating, respectively. The first grating and the third grating are formed with a first positional offset which is along a first direction. The second grating and the fourth grating are formed with a second positional offset which is along a second direction which is opposite to the first direction.

20 Claims, 21 Drawing Sheets

(56) References Cited

U.S. PATENT DOCUMENTS

| | | |
|---|---|---|
| 9,404,743 B2 | 8/2016 | Chiu et al. |
| 9,548,303 B2 | 1/2017 | Lee et al. |
| 2007/0229829 A1* | 10/2007 | Kandel ............... G03F 7/70633 356/401 |
| 2011/0229830 A1* | 9/2011 | Bhattacharyya .... G03F 7/70625 430/325 |
| 2012/0033215 A1* | 2/2012 | Kandel ............... G03F 7/70683 356/366 |
| 2015/0138523 A1* | 5/2015 | Jak ..................... G03F 7/70625 355/67 |
| 2016/0061589 A1* | 3/2016 | Bhattacharyya ....... G01B 11/14 356/620 |
| 2016/0334715 A1* | 11/2016 | Smilde ............... G03F 7/70625 |
| 2017/0045826 A1* | 2/2017 | Lee .................... G03F 7/70558 |
| 2017/0176871 A1* | 6/2017 | Van Buel ............ G03F 7/70683 |

* cited by examiner

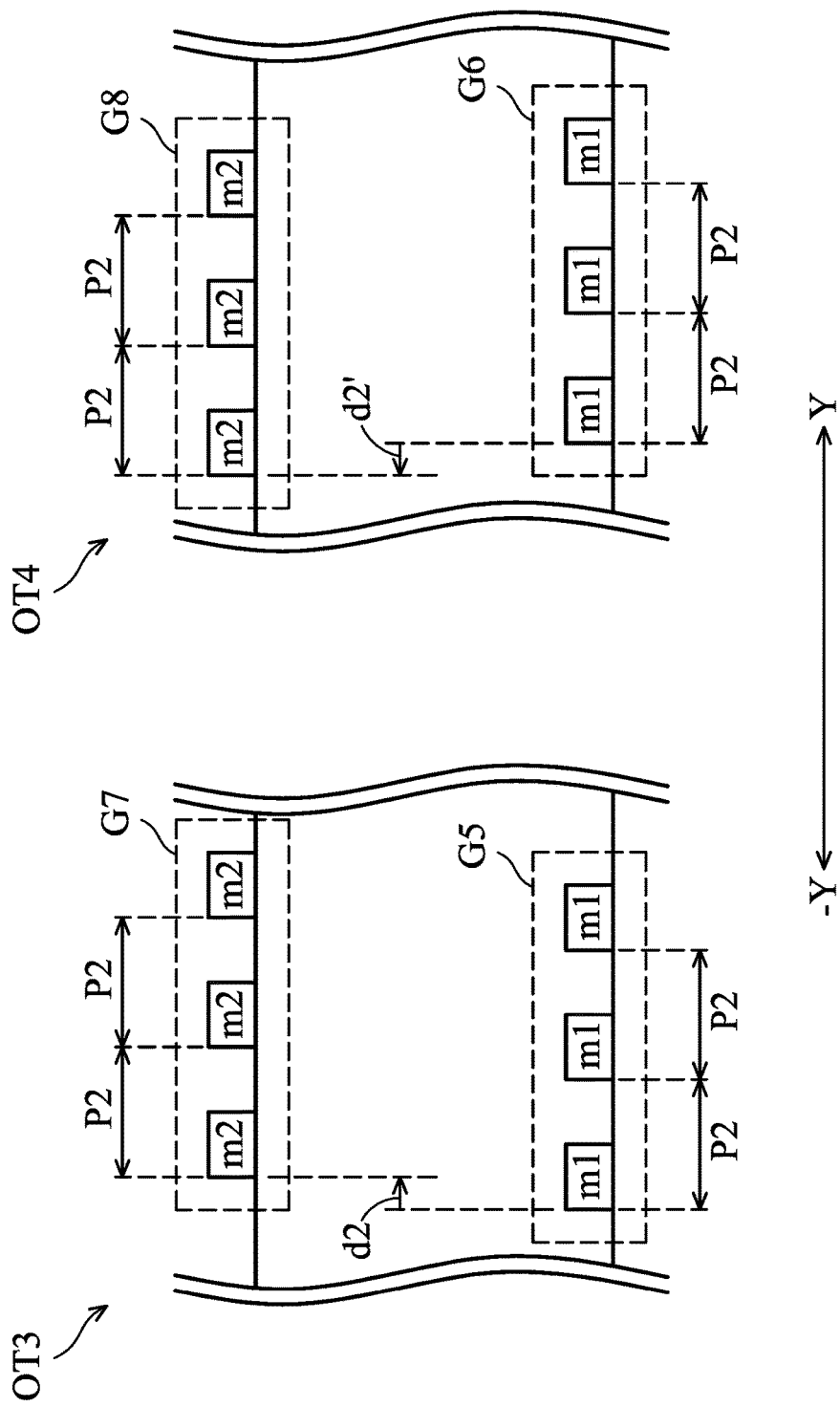

SEMICONDUCTOR METROLOGY TARGET AND MANUFACTURING METHOD THEREOF

BACKGROUND

Generally, a semiconductor integrated circuit (IC) is formed on multiple layers of a semiconductor substrate (or a semiconductor wafer). In order to properly fabricate a semiconductor integrated circuit, some layers of the substrate need to be aligned with each other. In such cases, a metrology target (or alignment mark) formed in a semiconductor substrate is utilized to perform the overlay (or alignment) measurements.

The metrology target may include a plurality of gratings, and an overlay shift between different layers of the semiconductor substrate can be measured based on the arrangement of the gratings.

Although existing metrology targets have generally been adequate for their intended purposes, they have not been entirely satisfactory in all respects. Consequently, there is a need for a metrology target and manufacturing method thereof that provides a solution for the overlay-shift measurement.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2C show a metrology target in accordance with some embodiments.

DETAILED DESCRIPTION

Figure 1:
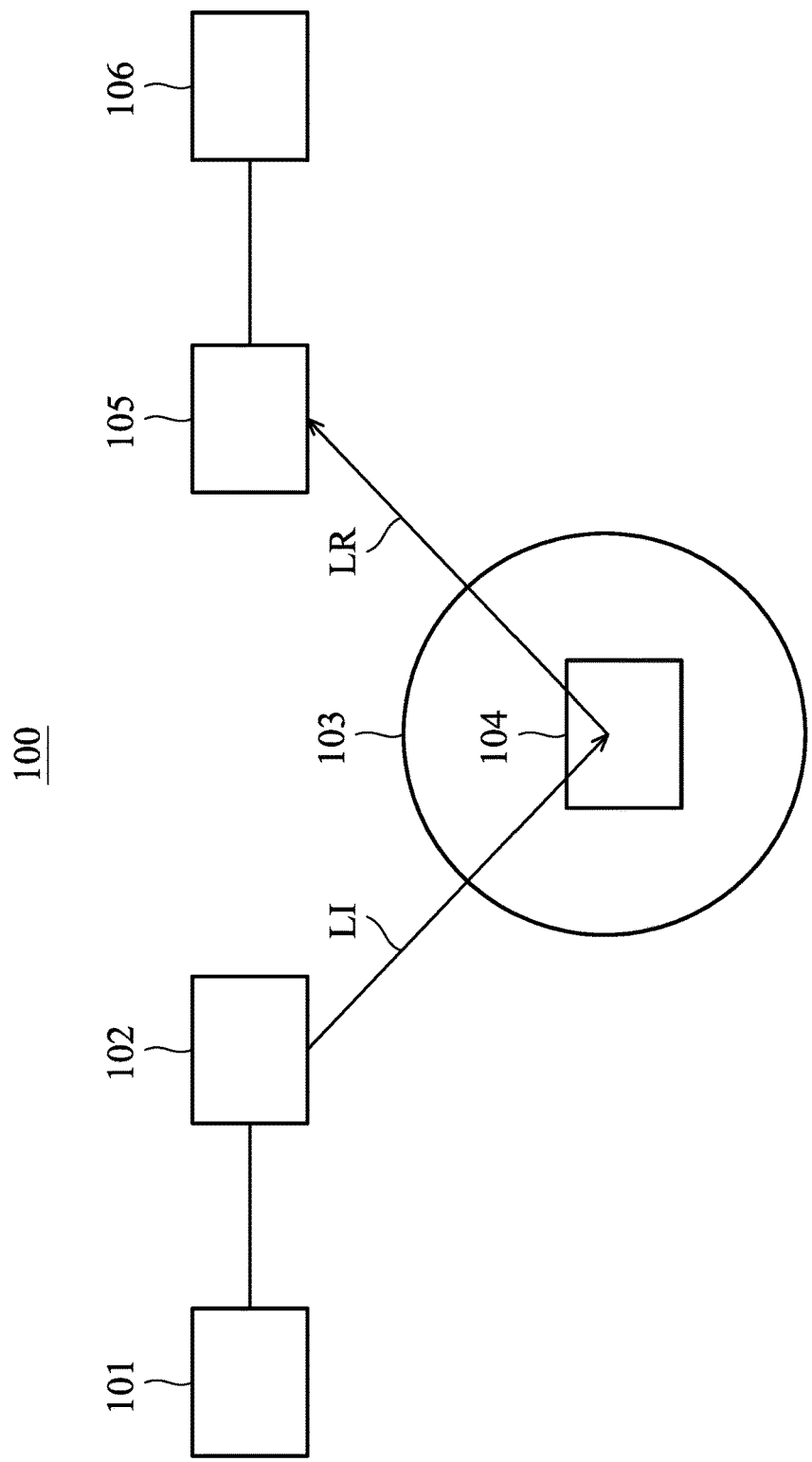
FIG. 1 shows a schematic diagram of an overlay-shift measurement system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a schematic diagram of an overlay-shift measurement system 100 in accordance with some embodiments. The overlay-shift measurement system 100 includes a light source 101, an optical device 102, a semiconductor device 103, a light detection circuit 105, and a processor 106. In some embodiments, the semiconductor device 103 is a semiconductor substrate (or a wafer) and includes a metrology target 104. In some embodiments, the semiconductor device 103 includes multiple layers, and the metrology target 104 includes a plurality of gratings which are formed in different layers and overlap each other.

In some embodiments, the overlay-shift measurement system 100 may perform a diffraction-based overlay (DBO) measurement on the metrology target 104. For example, the light source 101 is configured to provide light to the optical device 102, and then the optical device 102 provides the light LI to the metrology target 104. In response to the light LI illuminating the metrology target 104, the light LR is generated, and the light LR includes at least one diffraction light (e.g., +1 order or −1 order) corresponding to the light LI. The light detection circuit 105 is configured to detect the light LR and then generates the data corresponding to the light LR (e.g., the image data generated by the light LR). The processor 106 is configured to receive the data from the light detection circuit 105. Subsequently, the processor 106 analyzes the data to determine the overlay shift between the gratings, which are formed in different layers, of the metrology target 104.

In some embodiments, the processor 106 analyzes the light-intensity difference between the diffraction lights which are detected by the light detection circuit 105 to determine the overlay shift between gratings of the metrology target 104. In some embodiments, the aforementioned DBO measurement is performed after a lithography process.

Figure 2A:
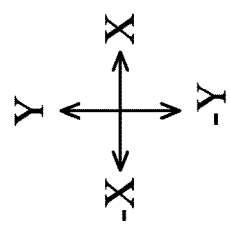

FIG. 2A shows a metrology target 104 in accordance with some embodiments. The metrology target 104 includes overlay targets OT1-OT4. In some embodiments, the overlay targets OT1 and OT2 are fabricated as FIG. 2B, and the overlay targets OT3 and OT4 are fabricated as FIG. 2C.

Figure 2B:
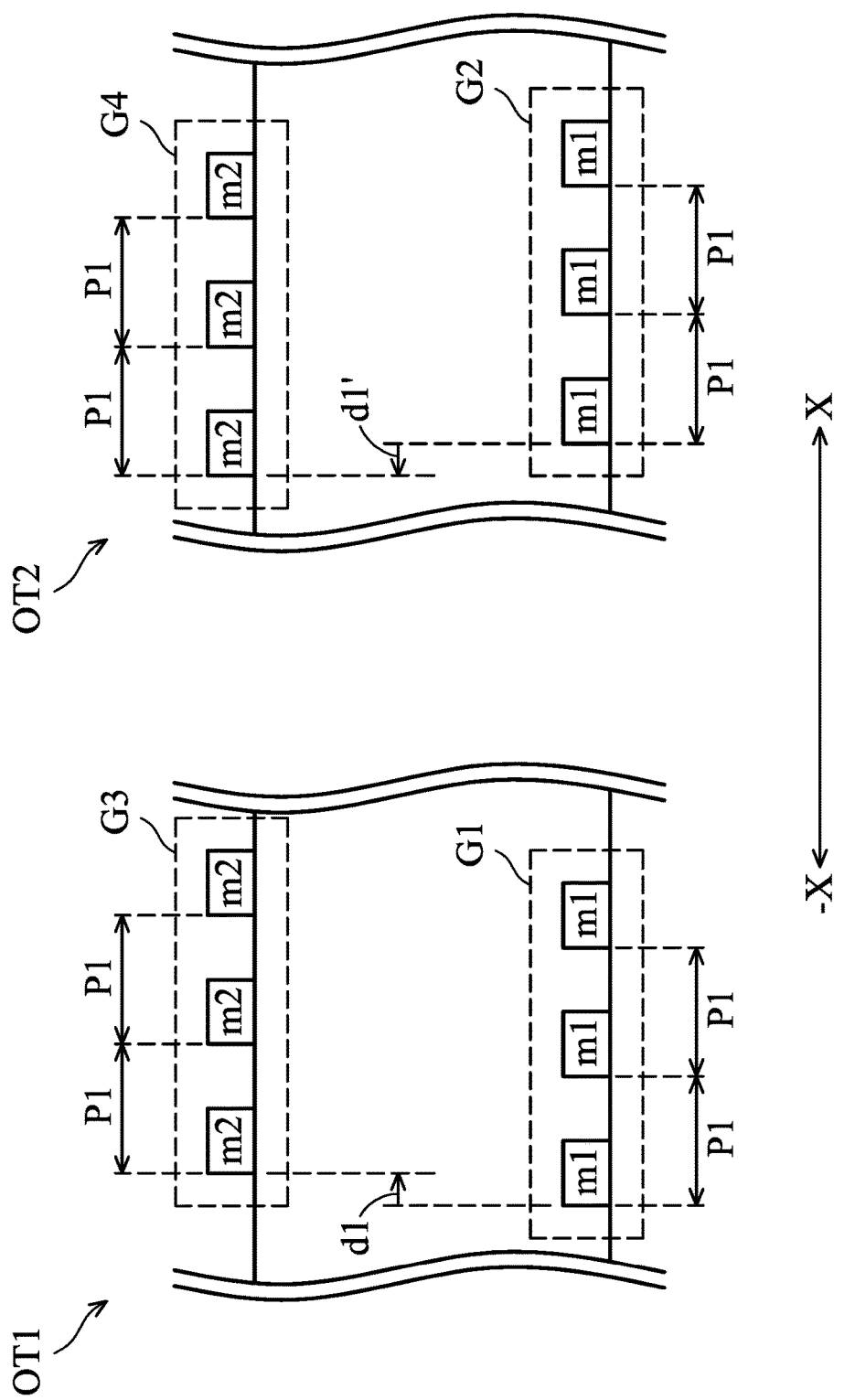

FIG. 2B shows the cross-sectional diagram of overlay targets OT1 and OT2 in accordance with some embodiments. The overlay target OT1 includes gratings G1 and G3. The grating G1 is formed in layer m1 of the semiconductor device 103, and the grating G3 is formed in layer m2 of the semiconductor device 103. In this embodiment, the gratings G1 and G3 are formed based on a spatial period P1. Specifically, the components of grating G1 are arranged to repeat with the spatial period P1, and the components of grating G3 are also arranged to repeat with the spatial period P1, as shown in FIG. 2B. Moreover, the grating G3 is placed to overlap the grating G1 and placed to have a predetermined offset (along the direction X) compared with the grating G1. In some embodiments, the process variation of the semiconductor device 103 may cause an unknown displacement between the gratings G1 and G3, which makes the gratings G1 and G3 have a positional offset d1 which is the combination of the predetermined offset and the unknown displacement. In this embodiment, the positional offset d1 is along the direction X, as shown in FIG. 2B.

On the other hand, the overlay target OT2 includes gratings G2 and G4. The grating G2 is formed in layer m1 of the semiconductor device 103, and the grating G4 is formed in layer m2 of the semiconductor device 103. In this embodiment, the gratings G2 and G4 are formed based on the spatial period P1. Specifically, the components of grating G2 are arranged to repeat with the spatial period P1, and the components of grating G4 are also arranged to repeat with the spatial period P1, as shown in FIG. 2B. Moreover, the grating G4 is placed to overlap the grating G2 and placed to have a predetermined offset (along the direction −X) compared with the grating G2. In some embodiments, the process variation of the semiconductor device 103 may cause an unknown displacement between the gratings G2 and G4, which makes the gratings G2 and G4 have a positional offset d1' which is the combination of the predetermined offset and the unknown displacement. In this embodiment, the positional offset d1' is along the direction −X, and the direction of the positional offset d1' is opposite to the direction of the positional offset d1, as shown in FIG. 2B.

In some embodiments, the magnitude of the positional offset d1 is the same as the magnitude of the positional offset d1' if the positional offsets d1 and d1' are not affected by the unknown displacement. In some embodiments, the unknown displacement is caused by the process variations which are generated during the manufacturing of the semiconductor device 103 (e.g., erosion, dishing, etc).

In some embodiments, the overlay-shift measurement system 100 performs the DBO measurement on the overlay targets OT1 and OT2 to determine the overlay shift, which occurs in directions X or −X, of the semiconductor device 103 based on the diffraction lights (e.g., +1 order, −1 order, etc.) generated by the light LI and the overlay targets OT1 and OT2.

For example, the light LI in FIG. 1 illuminates the overlay targets OT1 and OT2 to generate the light LR. Next, the light LR is detected by the light detection circuit 105 and converted to image data. Based on the image data, the processor 106 determines an asymmetry signal (ASX1) which represents the asymmetry in the intensity of different diffraction orders (e.g., +1 order and −1 order, or other orders) generated by the light LI and the overlay target OT1 and determines an asymmetry signal (ASX2) which represents the asymmetry in the intensity of different diffraction orders generated by the light LI and the overlay target OT2.

Furthermore, the processor 106 determines the overlay shift (OVS1), which occurs in directions X or −X, of the metrology target 104 based on equation (1) described below.

$$OVS1 = c1 \times \frac{1 + (ASX2/ASX1)}{1 - (ASX2/ASX1)} \quad (1)$$

The constant (c1) is a predetermined offset, and the positional offsets d1 and d1' are the combination of the predetermined offset (c1) and an unknown displacement (de1) caused by the process variations of the semiconductor device 103. For example, the positional offset d1 is equal to "c1+de1," and the positional offset d1' is equal to "−c1+de1".

Similarly, FIG. 2C shows the cross-sectional diagram of overlay targets OT3 and OT4 in accordance with some embodiments. The overlay target OT3 includes gratings G5 and G7. The grating G5 is formed in layer m1 of the semiconductor device 103, and the grating G7 is formed in layer m2 of the semiconductor device 103. In this embodiment, the gratings G5 and G7 are formed based on a spatial period P2. Specifically, the components of grating G5 are arranged to repeat with the spatial period P2, and the components of grating G7 are also arranged to repeat with the spatial period P2, as shown in FIG. 2C. Moreover, the grating G7 is placed to overlap the grating G5 and placed to have a predetermined offset (along the direction Y) compared with the grating G5. In some embodiments, the process variation of the semiconductor device 103 may cause an unknown displacement between the gratings G5 and G7, which makes the gratings G5 and G7 have a positional offset d2 which is the combination of the predetermined offset and the unknown displacement. In this embodiment, the positional offset d2 is along the direction Y, as shown in FIG. 2C. In some embodiments, the spatial period P1 can be equal to the spatial period P2. In some embodiments, the spatial period P1 can be different from the spatial period P2.

Additionally, the overlay target OT4 includes gratings G6 and G8. The grating G6 is formed in layer m1 of the semiconductor device 103, and the grating G8 is formed in layer m2 of the semiconductor device 103. In this embodiment, the gratings G6 and G8 are formed based on the spatial period P2. Specifically, the components of grating G6 are arranged to repeat with the spatial period P2, and the components of grating G8 are also arranged to repeat with the spatial period P2, as shown in FIG. 2C. Furthermore, the grating G8 is placed to overlap the grating G6 and placed to have a predetermined offset (along the direction −Y) compared with the grating G6. In some embodiments, the process variation of the semiconductor device 103 may cause an unknown displacement between the gratings G6 and G8, which makes the gratings G6 and G8 have a positional offset d2' which is the combination of the predetermined offset and the unknown displacement. In this embodiment, the positional offset d2' is along the direction −Y, and the direction of the positional offset d2' is opposite to the direction of the positional offset d2, as shown in FIG. 2C.

In some embodiments, the magnitude of the positional offset d2 is the same as the magnitude of the positional offset d2' if the positional offsets d2 and d2' are not affected by an unknown displacement. In some embodiments, the unknown displacement is caused by the process variations which are generated during the manufacturing of the semiconductor device 103 (e.g., erosion, dishing, or the like).

In some embodiments, the overlay-shift measurement system 100 performs the DBO measurement on the overlay targets OT3 and OT4 to determine the overlay shift, which occurs in directions Y or −Y, of the semiconductor device 103 based on the diffraction lights (e.g., +1 order, −1 order, etc.) generated by the light LI and the overlay targets OT3 and OT4.

For example, the light LI in FIG. 1 illuminates the overlay targets OT3 and OT4 to generate the light LR. Next, the light LR is detected by the light detection circuit 105 and converted to image data. Based on the image data, the processor 106 determines an asymmetry signal (ASY1) which represents the asymmetry in the intensity of different diffraction orders (e.g., +1 order and −1 order, or other orders) generated by the light LI and the overlay target OT3 and determines an asymmetry signal (ASY2) which represents the asymmetry in the intensity of different diffraction orders generated by the light LI and the overlay target OT4.

Furthermore, the processor 106 determines the overlay shift (OVS2), which occurs in directions Y or −Y, of the metrology target 104 based on equation (2) described below.

$$OVS2 = c2 \times \frac{1 + (ASY2/ASY1)}{1 - (ASY2/ASY1)} \quad (2)$$

The constant (c2) is a predetermined offset, and the positional offsets d2 and d2' are the combination of the predetermined offset (c2) and an unknown displacement (de2) caused by the process variations of the semiconductor device 103. For example, the positional offset d2 is equal to "c2+de2," and the positional offset d2' is equal to "−c2+de2".

In some embodiments, the placement of the metrology target 104 can be changed. For example, the positions of overlay targets OT1 and OT2 can be exchanged, or the positions of overlay targets OT3 and OT4 can be exchanged. In some embodiments, the component density of the metrology target 104 may be different from the component density around the metrology target 104. In such cases, the dishing may occur at the metrology target 104, or the erosion may occur at multiple metrology targets 104.

Figure 3A:
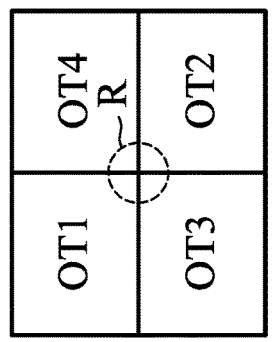
FIGS. 3A-3D show a metrology target having a dishing effect in accordance with some embodiments.
Figure 3A:
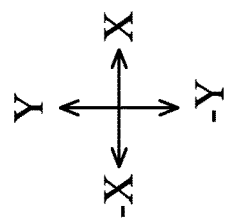
Figure 3B:
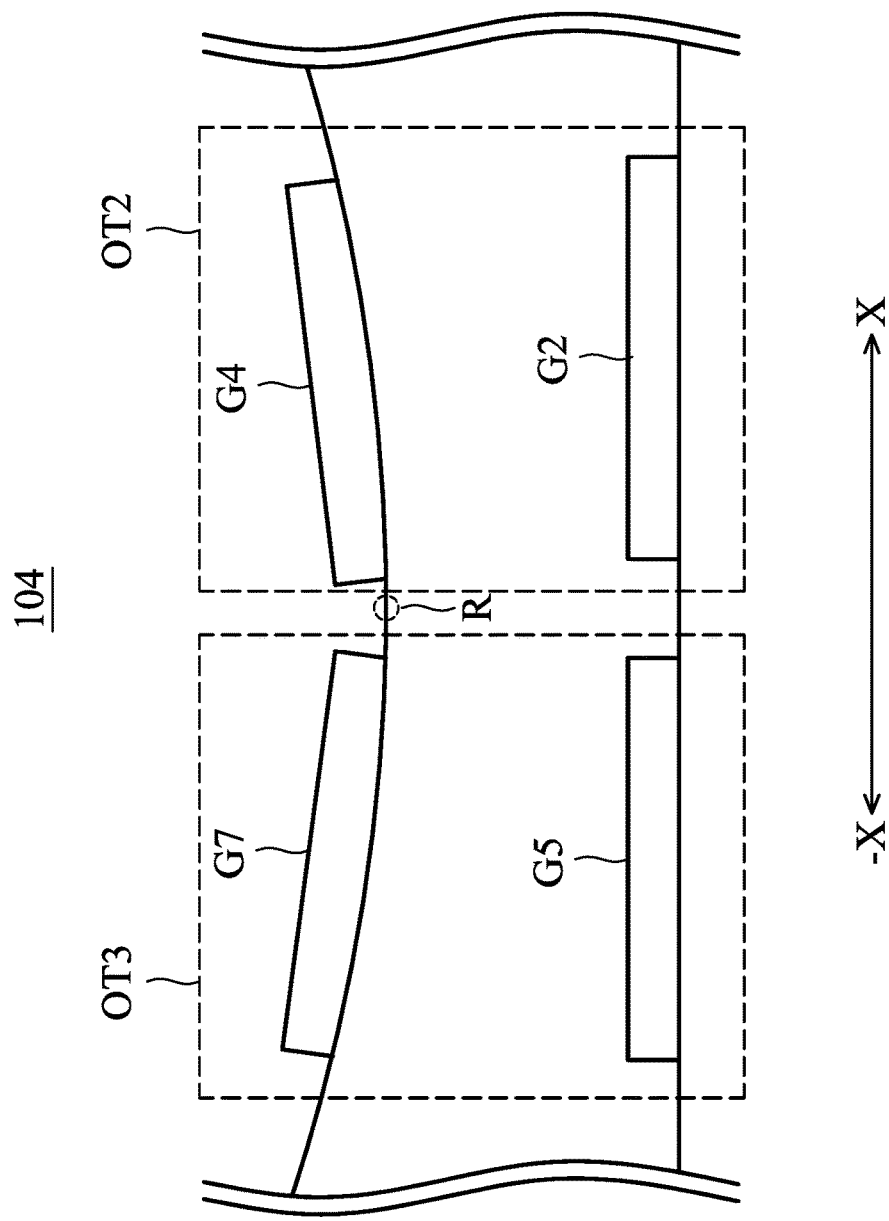
Figure 3C:
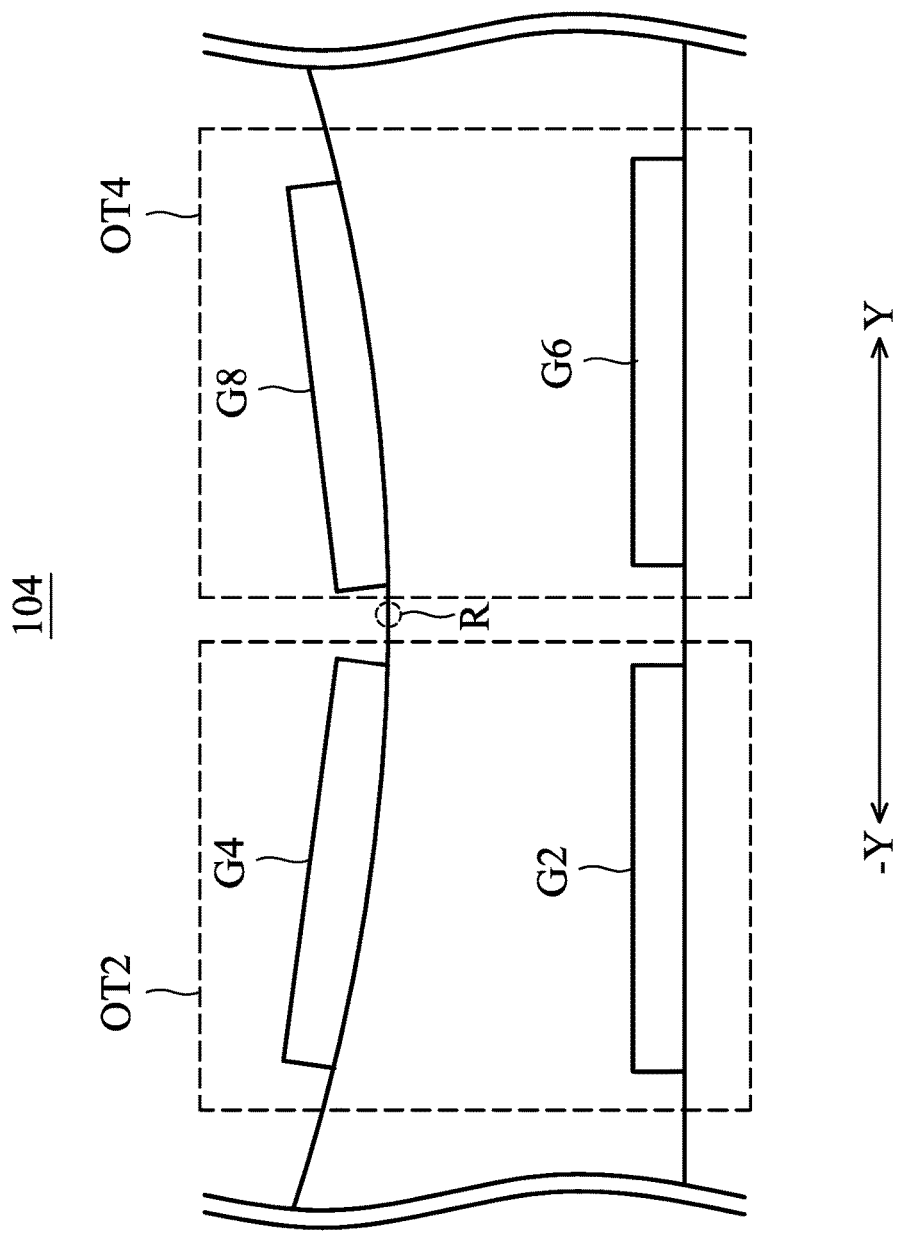

FIGS. 3A-3D show the metrology target 104 having a dishing effect in accordance with some embodiments. In some embodiments, the component density of the metrology target 104 in layer m1 is lower than the component density of patterns around the metrology target 104 in layer m1, and the dishing effect occurs at structures, which are formed over the layer m1, of the metrology target 104. In such cases, the dishing effect causes the metrology target 104 to have a substantially bowl shape (as shown in FIGS. 3B and 3C), and the lowest position is located in the region R (as shown in FIGS. 3A-3D).

FIGS. 3B and 3C show the cross-sectional diagram of the metrology target 104 having the dishing effect in accordance with some embodiments. The component density of the metrology target 104 in the layer m1 is different from the component density of patterns in the layer m1 around the metrology target 104 (e.g., the component density of gratings G1, G2, G5, and G6 is lower than the component density of patterns around the gratings G1, G2, G5, and G6). In such cases, dishing effect occurs at structures, which are formed over the layer m1 (e.g., the layer m2), of the metrology target 104, and the gratings G3, G4, G7, and G8 are sunk by the dishing effect, which causes the shift of the DBO measurement performed based on the metrology target 104.

Figure 3D:
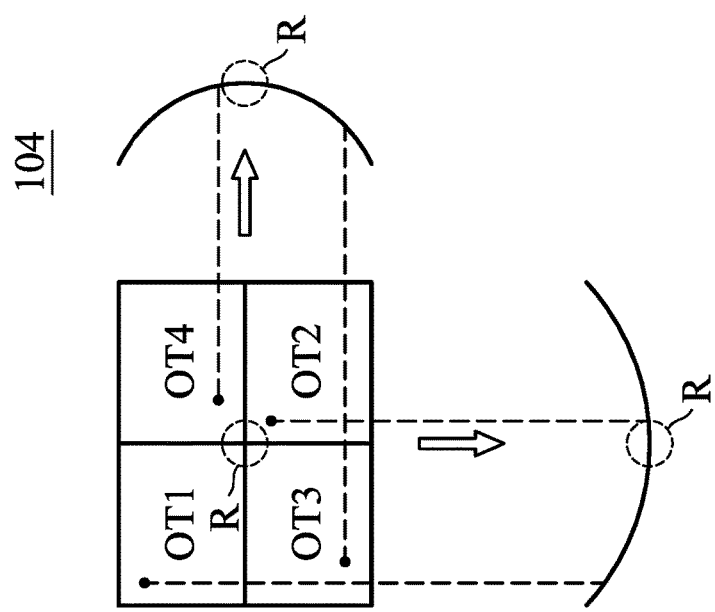
Figure 3D:
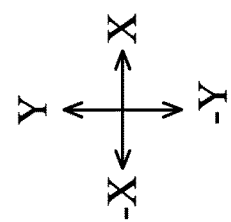

As shown in FIG. 3D, the dishing effect makes the components in layer m2 of the overlay targets OT1 and OT2 have different altitude and be tilted by different angles. Accordingly, the asymmetry signal (ASX1) corresponding to the overlay target OT1 and the asymmetry signal (ASX2) corresponding to the overlay target OT2 are affected by different altitude deviation and different angle changes, which makes the asymmetry signal (ASX1) have deviation (A1) and makes the asymmetry signal (ASX2) have deviation (A2) which is different from deviation (A1).

According to equation (1), the overlay shift OVS1 corresponds to the ratio of the asymmetry signals (ASX2) and (ASX1). Since the deviation (A1) of the asymmetry signal (ASX1) is different from the deviation (A2) of the asymmetry signal (ASX2), the ratio of the asymmetry signals (ASX2) and (ASX1) under the dishing effect has additional deviation and is not equal to the original ratio of the asymmetry signals (ASX2) and (ASX1), which can be represented as:

$$\frac{ASX2 + A2}{ASX1 + A1} \neq \frac{ASX2}{ASX1}$$

In such cases, the overlay shift (OVS1) in equation (1) is affected by the dishing effect, and the accuracy of the overlay shift (OVS1) is degraded.

Similarly, since the deviation (B1) of the asymmetry signal (ASY1) is different from the deviation (B2) of the asymmetry signal (ASY2), the ratio of the asymmetry signals (ASY2) and (ASY1) under the dishing effect has additional deviation and is not equal to the original ratio of the asymmetry signals (ASY2) and (ASY1), which can be represented as:

$$\frac{ASY2 + B2}{ASY1 + B1} \neq \frac{ASY2}{ASY1}$$

In such cases, the overlay shift (OVS2) in equation (2) is affected by the dishing effect, and the accuracy of the overlay shift (OVS2) is degraded.

Figure 4A:
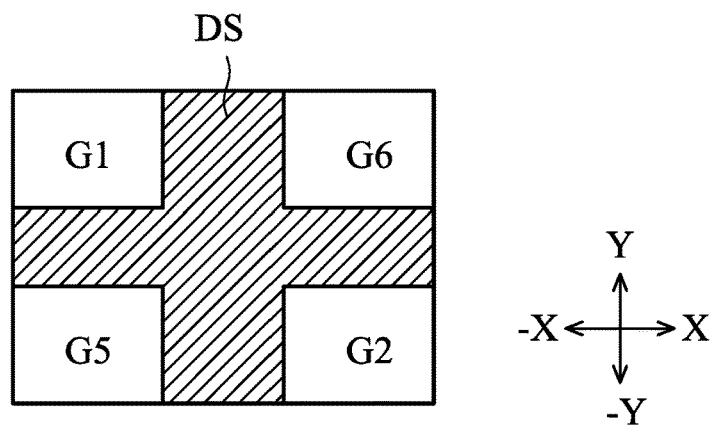
FIGS. 4A-4D show a metrology target including a dummy structure in accordance with some embodiments.
Figure 4B:
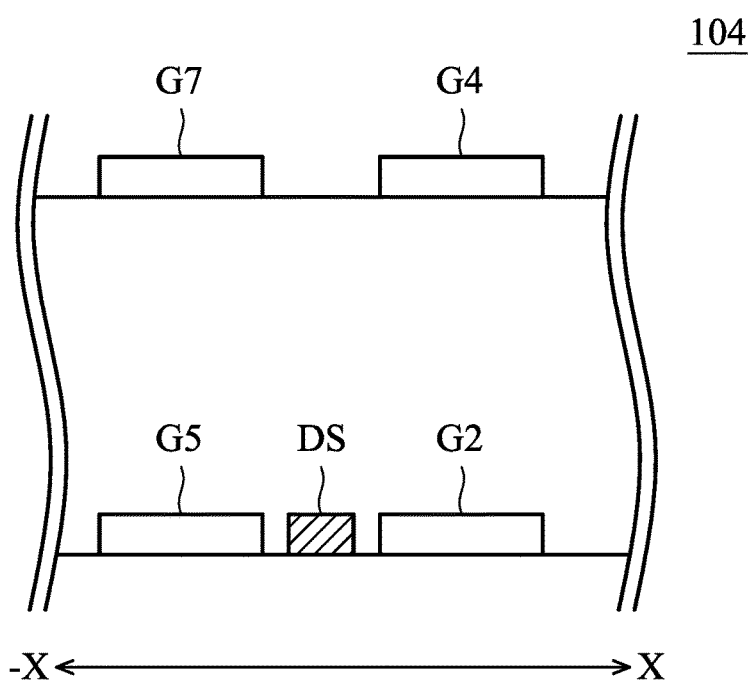
Figure 4C:
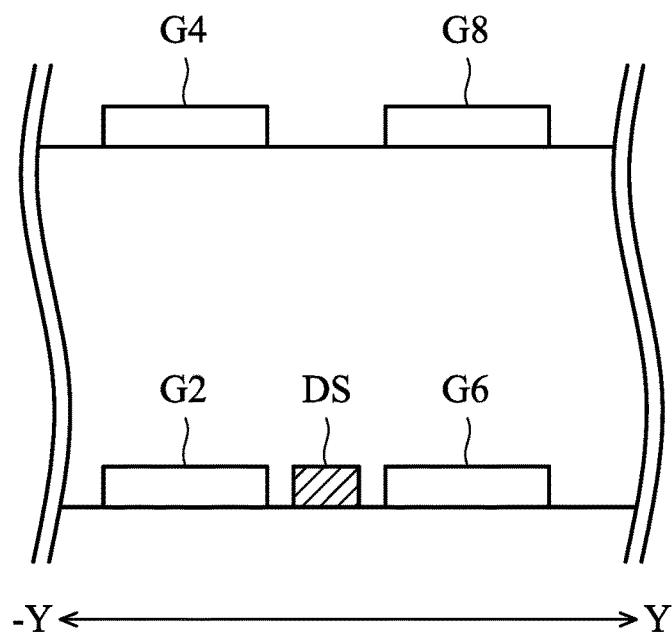

FIGS. 4A-4C show a metrology target 104 including a dummy structure DS in accordance with some embodiments. Referring to FIG. 4A, the dummy structure DS is formed between each grating in the layer m1 of the metrology target 104, and the material of the dummy structure DS is the same as the gratings G1, G2, G5, and G6. In some embodiments, the layer m1 can be metal.

FIGS. 4B and 4C show the cross-sectional diagram of the metrology target 104 including the dummy structure DS in accordance with some embodiments. In some embodiments, the component density of the metrology target 104 in layer m1 is lower than the component density of patterns around the metrology target 104 in layer m1, and the dummy structure DS is placed between each grating of the metrology target 104 in the layer m1. The dummy structure DS reduces the difference in component density between the metrology target 104 and the patterns formed around the metrology target 104 in layer m1. Since the component density of the metrology target 104 in layer m1 is close to the component density of patterns formed around the metrology target 104 in the layer m1, the dishing effect occurring at layer m2 can be improved as shown in FIGS. 4B and 4C. In such cases, the accuracy of the DBO measurement performed based on the metrology target 104 is also improved.

Figure 4D:
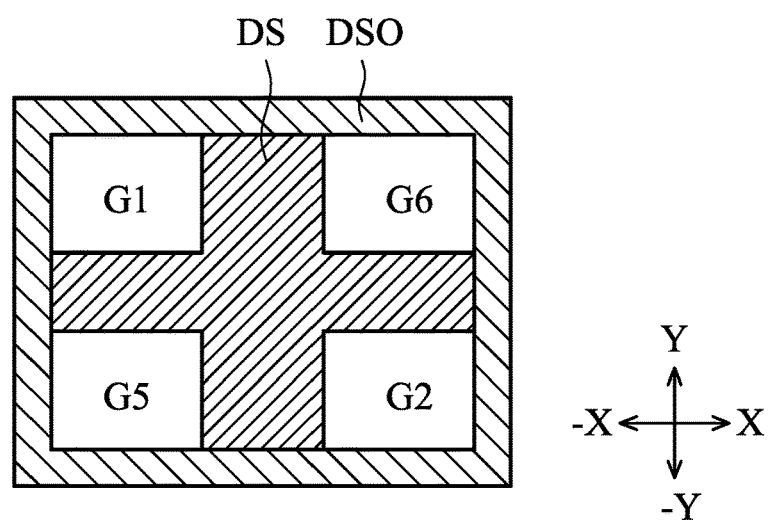

In some embodiments, each grating in layer m1 of the metrology target 104 is surrounded by dummy components. As shown in FIG. 4D, the gratings G1, G2, G5, and G6 are respectively surrounded by the dummy components of the dummy structures DS and DSO to reduce the difference in component density between the metrology target 104 and the patterns formed around the metrology target 104 in layer m1.

Figure 5:
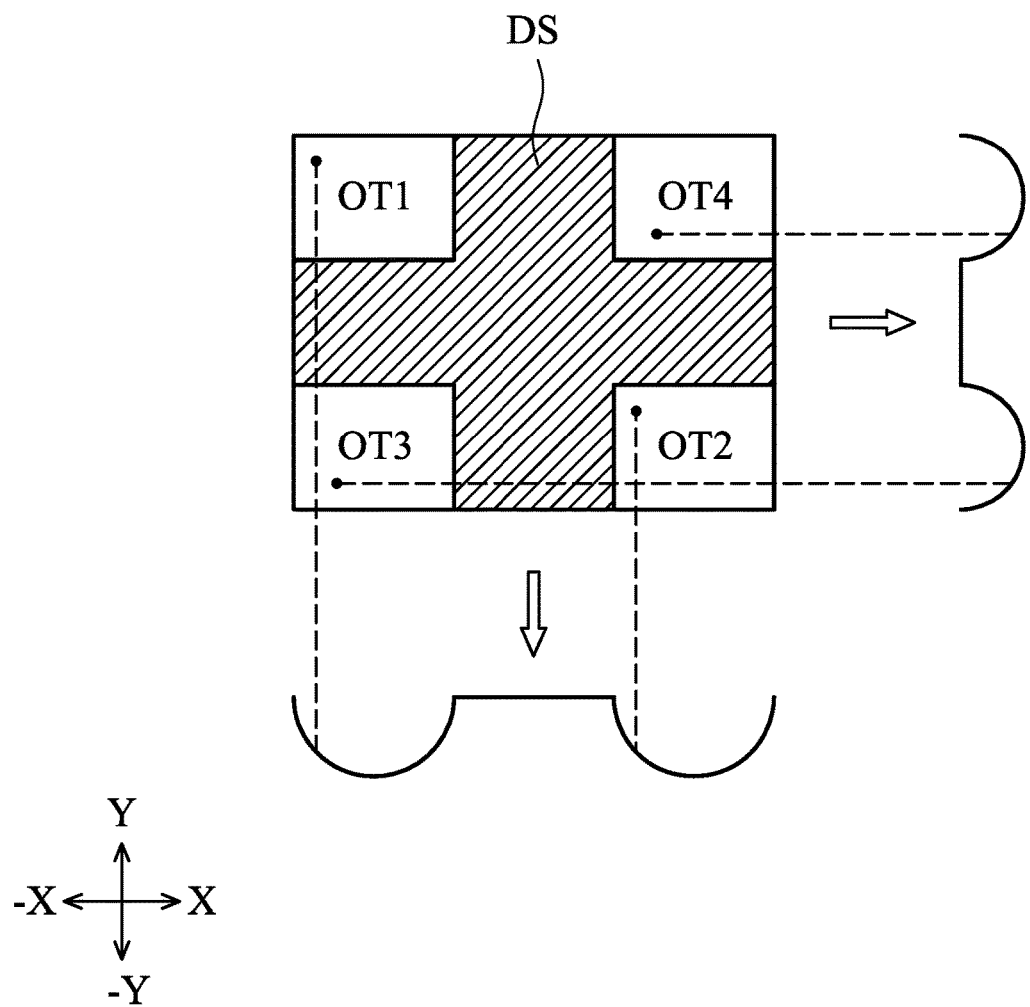
FIG. 5 shows a metrology target including a dummy structure in accordance with some embodiments.

In some embodiments, the metrology target 104 having dummy structure may still have the dishing effect in the area of each grating in the layer m2, as shown in FIG. 5. In such cases, since each grating in the layer m2 (e.g., gratings G3, G4, G7, and G8) of the metrology target 104 is sunk based on its own central area, the gratings of the metrology target 104 in the layer m2 have similar shape distortion, as shown in FIG. 5. Accordingly, the asymmetry signals (ASX1), (ASX2), (ASY1), and (ASY2) respectively corresponding to the overlay targets OT1, OT2, OT3, and OT4 are affected by similar altitude deviation and similar angle changes.

For example, the deviation (A11) of the asymmetry signals (ASX1) and the deviation (A22) of the (ASX2) are similar to each other, which can be represented as:

$$\frac{ASX2 + A22}{ASX1 + A11} \approx \frac{ASX2}{ASX1}$$

In such cases, the accuracy of the overlay shift (OVS1) in equation (1) can be maintained.

Similarly, the deviation (B11) of the asymmetry signals (ASY1) and the deviation (B22) of the (ASY2) are similar to each other, which can be represented as:

$$\frac{ASY2 + B22}{ASY1 + B11} \approx \frac{ASY2}{ASY1}$$

In such cases, the accuracy of the overlay shift (OVS2) in equation (2) can be maintained.

Figure 6A:
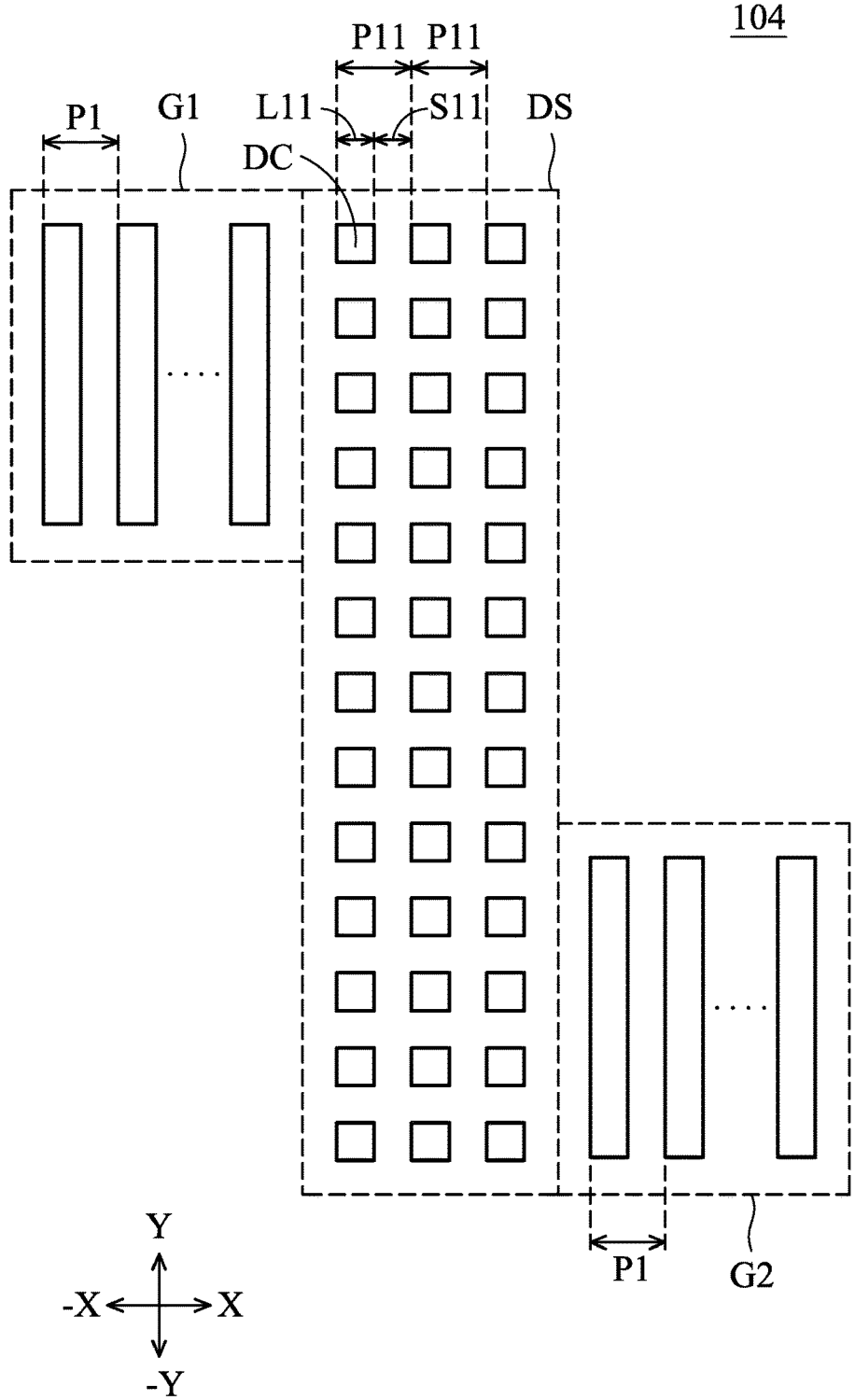
FIGS. 6A-6B show metrology targets which respectively include a dummy structure in accordance with some embodiments.

FIG. 6A shows the metrology target 104 including the dummy structure DS in accordance with some embodiments. The metrology target 104 includes overlay targets OT1 and OT2 as shown in FIG. 2B. FIG. 6A shows the components of the metrology target 104 in layer m1 for the purpose of clarity.

As shown in FIG. 6A, the gratings G1 and G2 are formed based on the spatial period P1. Specifically, the components of grating G1 are arranged to repeat with the spatial period P1, and the components of grating G2 are also arranged to repeat with the spatial period P1. In such cases, the workable wavelength ($\lambda_x$) corresponding to the overlay targets OT1 and OT2 of the metrology target 104 can be represented by equation (3).

$$P1 \times NA_{min} < \lambda_x < P1 \times NA_{max} \quad (3)$$

The parameter (NA) is the numerical aperture of the optical device 102. In some embodiments, the parameter (NA) is a value from 0.7 to 1.35 (i.e., the parameter ($NA_{min}$) is 0.7 and the parameter ($NA_{max}$) is 1.35), which allows the light LR (as shown in FIG. 1) generated based on the overlay targets OT1 and OT2 to be detected correctly by the light detection circuit 105.

As shown in FIG. 6A, the dummy structure DS includes multiple dummy components DC which are periodically placed along the direction X. In the direction X, the dummy components DC are arranged to repeat with the spatial period P11 which are the sum of the length L11 (which is the side length of one dummy component DC) and length S11 (which is the space between two adjacent dummy components DC).

In some embodiments, the spatial period P11 is less than the spatial period P1 to avoid the dummy components DC affecting the results of the DBO measurement performed based on the overlay targets OT1 and OT2. For example, when the spatial period P11 is less than the spatial period P1, the brightness of the image data corresponding to the dummy structure DS is different from (e.g., darker than) the brightness of the image data corresponding to the overlay targets OT1 and OT2 of the metrology target 104 (wherein the image data is generated by the light detection circuit 105). When the spatial period P11 is less than the spatial period P1 to make the processor 106 be able to distinguish the image data corresponding to the dummy structure DS and the image data corresponding to the overlay targets of the metrology target 104, the processor 106 can analyze the image data corresponding to the overlay targets OT1 and OT2 of the metrology target 104 correctly. In some embodiments, the spatial period P11 is represented as $$P11 < P1 \times \frac{\lambda_{x,min}}{NA_{max}},$$

wherein the ($\lambda_{x, min}$) is the minimum workable wavelength corresponding to the overlay targets OT1 and OT2 of the metrology target 104. Based on equation (3), the spatial period P11 is further represented by equation (4).

$$P11 < P1 \times \frac{NA_{min}}{NA_{max}} \quad (4)$$

In some embodiments, the spatial period P11 is less than the minimum workable wavelength ($\lambda_{x, min}$) corresponding to the overlay targets OT1 and OT2 of the metrology target 104.

In some embodiments, the spatial period P11 is greater than the spatial period P1 to avoid the dummy components DC affecting the results of the DBO measurement performed based on the overlay targets OT1 and OT2. In some embodiments, the spatial period P11 is represented as $$P11 > P1 \times \frac{\lambda_{x,max}}{NA_{min}},$$

wherein the ($\lambda_{x, max}$) is the maximum workable wavelength corresponding to the overlay targets OT1 and OT2 of the metrology target 104. Based on equation (3), the spatial period P11 is further represented by equation (5).

$$P11 > P1 \times \frac{NA_{max}}{NA_{min}} \quad (5)$$

In some embodiments, the spatial period P11 is greater than the maximum workable wavelength ($\lambda_{x, max}$) corresponding to the overlay targets OT1 and OT2 of the metrology target 104.

Based on equation (5), the spatial period P11 is greater than the spatial period P1. In such cases, the brightness of the image data corresponding to the dummy structure DS is different from the brightness of the image data corresponding to the overlay targets OT1 and OT2 of the metrology target 104 (wherein the image data is generated by the light detection circuit 105), and the processor 106 is able to distinguish the image data corresponding to the dummy structure DS and the image data corresponding to the overlay targets OT1 and OT2 of the metrology target 104 and makes the processor 106 analyze the image data corresponding to the overlay targets OT1 and OT2 of the metrology target 104 correctly.

Figure 6B:
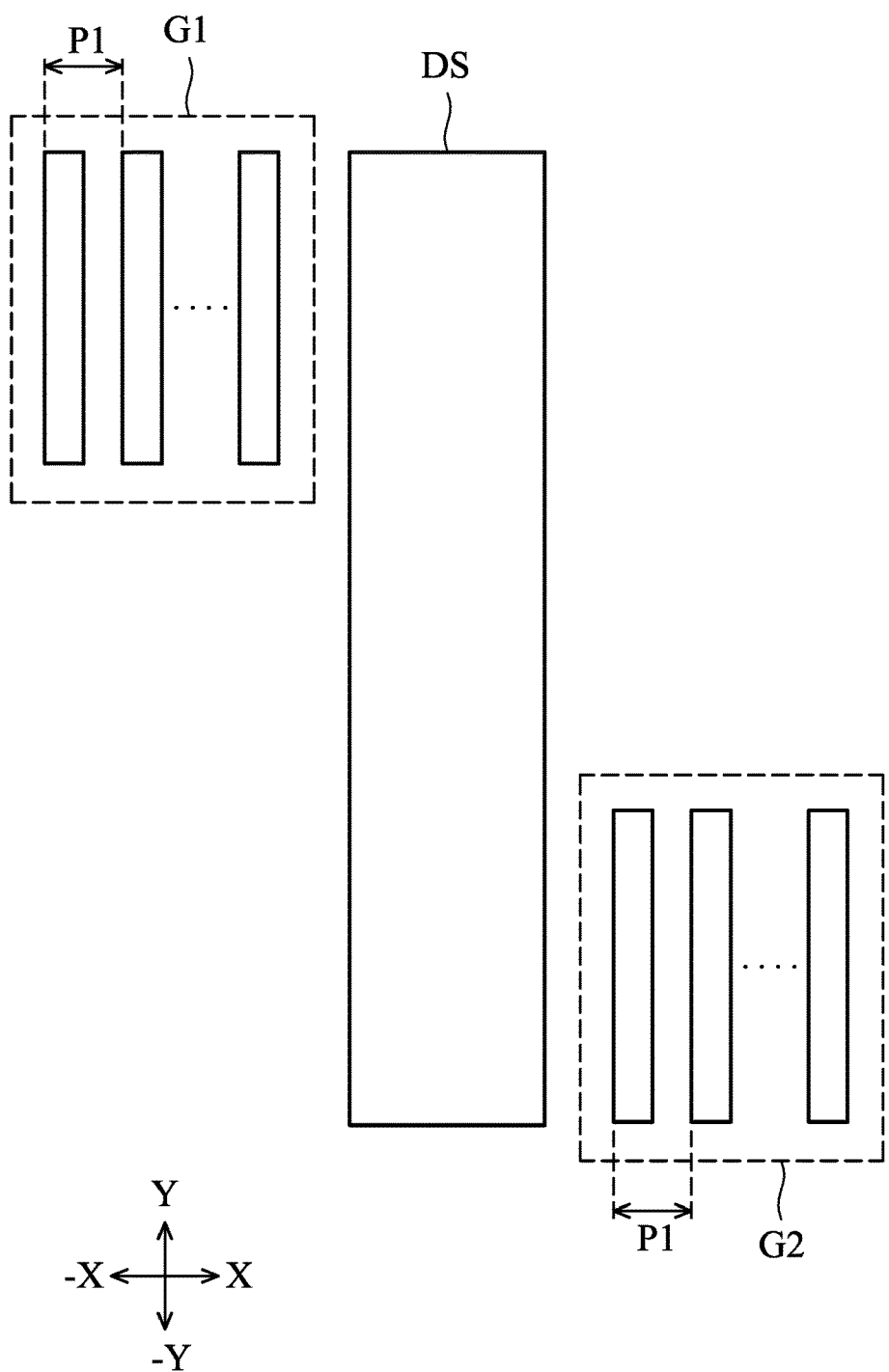

FIG. 6B shows metrology target 104 including the dummy structure DS in accordance with some embodiments. The metrology target 104 includes overlay targets OT1 and OT2 as shown in FIG. 2B. FIG. 6B shows the components of the metrology target 104 in layer m1 for the purpose of clarity.

As shown in FIG. 6B, the dummy structure DS is extended along the directions Y and −Y to separate the gratings G1 and G2. In this embodiment, the dummy structure is not formed based on a spatial period and is formed by a single dummy component, which makes the brightness of the image data corresponding to the dummy structure DS different from the brightness of the image data corresponding to the overlay targets OT1 and OT2 of the metrology target 104 (wherein the image data is generated by the light detection circuit 105). Accordingly, the processor 106 can distinguish the image data corresponding to the dummy structure DS and the image data corresponding to the overlay targets OT1 and OT2 of the metrology target 104 and analyze the image data corresponding to the overlay targets OT1 and OT2 of the metrology target 104 correctly.

Figure 7A:
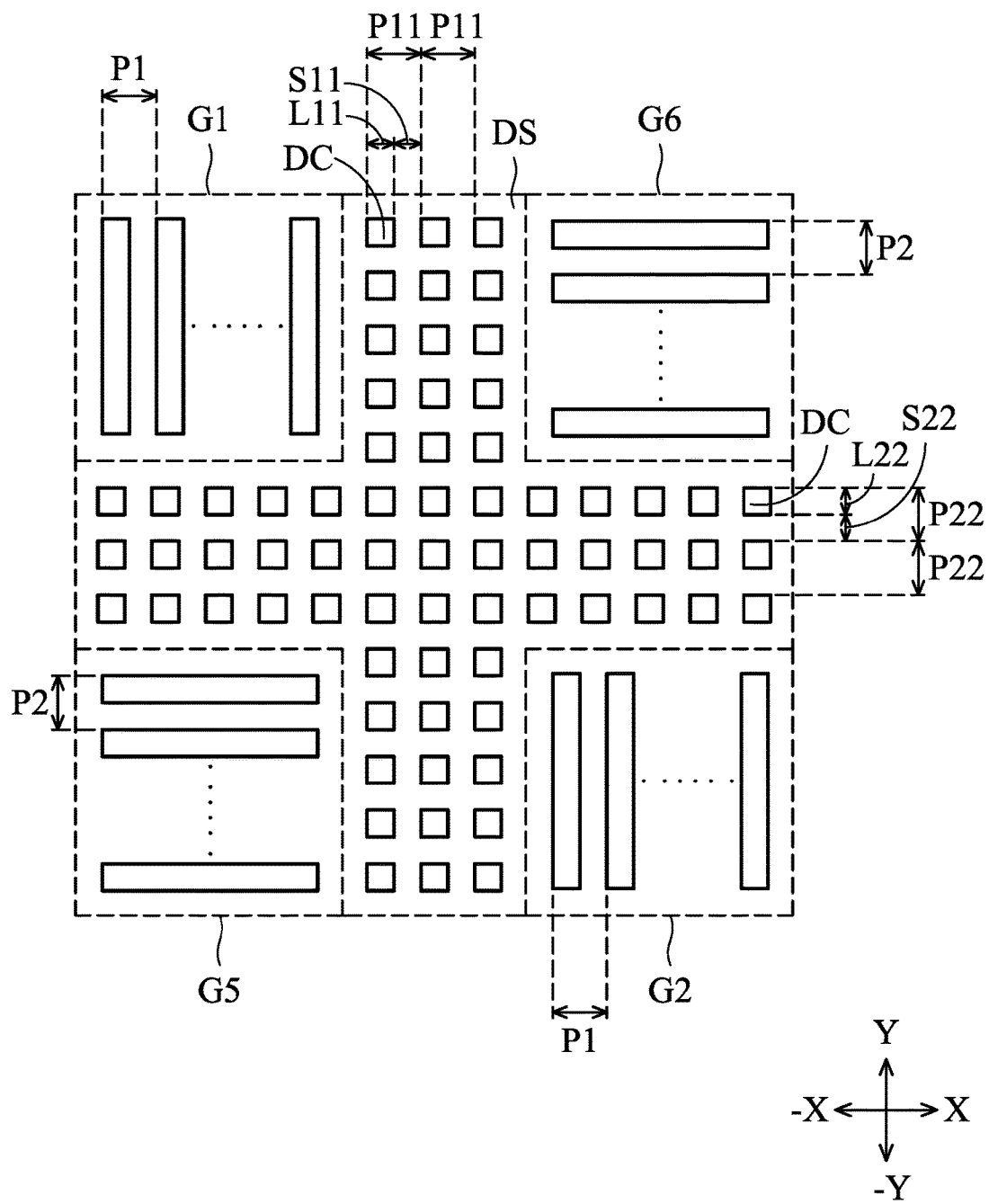
FIGS. 7A-7D show metrology targets which respectively include a dummy structure in accordance with some embodiments.

FIG. 7A shows the metrology target 104 including the dummy structure DS in accordance with some embodiments. The metrology target 104 includes overlay targets OT1-OT4 as shown in FIGS. 2A-2C. FIG. 7A shows the components of the metrology target 104 in layer m1 for the purpose of clarity.

As shown in FIG. 7A, the gratings G1 and G2 are formed based on the spatial period P1, and the workable wavelength ($\lambda_x$) corresponding to the overlay targets OT1 and OT2 of the metrology target 104 are represented by equation (3) according to the content described in FIG. 6A. The gratings G5 and G6 are formed based on the spatial P2. Specifically, the components of gratings G5 and G6 are arranged to repeat with the spatial period P2, respectively. In such cases, the workable wavelength ($\lambda_y$) corresponding to the overlay targets OT3 and OT4 of the metrology target 104 can be represented by equation (6).

$$P2 \times NA_{min} < \lambda_y < P2 \times NA_{max} \qquad (6)$$

The parameter (NA) is the numerical aperture of the optical device 102. In some embodiments, the parameter (NA) is a value from 0.7 to 1.35 (i.e., the parameter ($NA_{min}$) is 0.7 and the parameter ($NA_{max}$) is 1.35), which allows the light LR (as shown in FIG. 1) generated based on the overlay targets OT3 and OT4 to be detected correctly by the light detection circuit 105.

As shown in FIG. 7A, the dummy structure DS includes multiple dummy components DC which are periodically placed along the directions X and Y. In direction X, the dummy components DC are arranged to repeat with the spatial period P11 which are the sum of the length L11 (which is the side length of one dummy component DC) and length S11 (which is the space between two adjacent dummy components DC). In direction Y, the dummy components DC are arranged to repeat with the spatial period P22 which are the sum of the length L22 (which is the side length of one dummy component DC) and length S22 (which is the space between two adjacent dummy components DC), as shown in FIG. 7A.

The design condition (e.g., equations (3)-(5)) of the dummy components and the gratings G1 and G2 are similar (or equal) to the embodiments described in FIG. 6A, and they are not repeated again.

In some embodiments, the spatial period P22 is less than the spatial period P2 to avoid the dummy components DC affecting the results of the DBO measurement performed based on the overlay targets OT3 and OT4. For example, when the spatial period P22 is less than the spatial period P2 to make the processor 106 be able to distinguish the image data corresponding to the dummy structure DS and the image data corresponding to the overlay targets OT3 and OT4 of the metrology target 104 (wherein the image data is generated by the light detection circuit 105), the processor 106 can analyze the image data corresponding to the overlay targets of the metrology target 104 correctly. In some embodiments, the spatial period P22 is represented as:

$$P22 < P2 \times \frac{\lambda_{y,min}}{NA_{max}},$$

wherein the ($\lambda_{y, min}$) is the minimum workable wavelength corresponding to the overlay targets OT3 and OT4 of the metrology target 104. Based on equation (6), the spatial period P22 is further represented by equation (7).

$$P22 < P2 \times \frac{NA_{min}}{NA_{max}} \qquad (7)$$

In some embodiments, the spatial period P22 is less than the minimum workable wavelength ($\lambda_{y, min}$) corresponding to the overlay targets OT3 and OT4 of the metrology target 104.

In some embodiments, the spatial period P22 is greater than the spatial period P2 to avoid the dummy components DC affecting the results of the DBO measurement performed based on the overlay targets OT3 and OT4. In some embodiments, the spatial period P22 is represented as $$P22 > P2 \times \frac{\lambda_{y,max}}{NA_{min}}.$$

Based on equation (6), the spatial period P22 is further represented by equation (8).

$$P22 > P2 \times \frac{NA_{max}}{NA_{min}} \qquad (8)$$

In some embodiments, the spatial period P22 is greater than the maximum workable wavelength ($\lambda_{y, max}$) corresponding to the overlay targets OT3 and OT4 of the metrology target 104.

Based on equation (8), the spatial period P22 is greater than the spatial period P2. In such cases, the brightness of the image data corresponding to the dummy structure DS is different from the brightness of the image data corresponding to the overlay targets OT3 and OT4 of the metrology target 104 (wherein the image data is generated by the light detection circuit 105), and the processor 106 is able to distinguish the image data corresponding to the dummy structure DS and the image data corresponding to the overlay targets OT3 and OT4 of the metrology target 104 and makes the processor 106 analyze the image data corresponding to the overlay targets OT3 and OT4 of the metrology target 104 correctly.

Figure 7B:
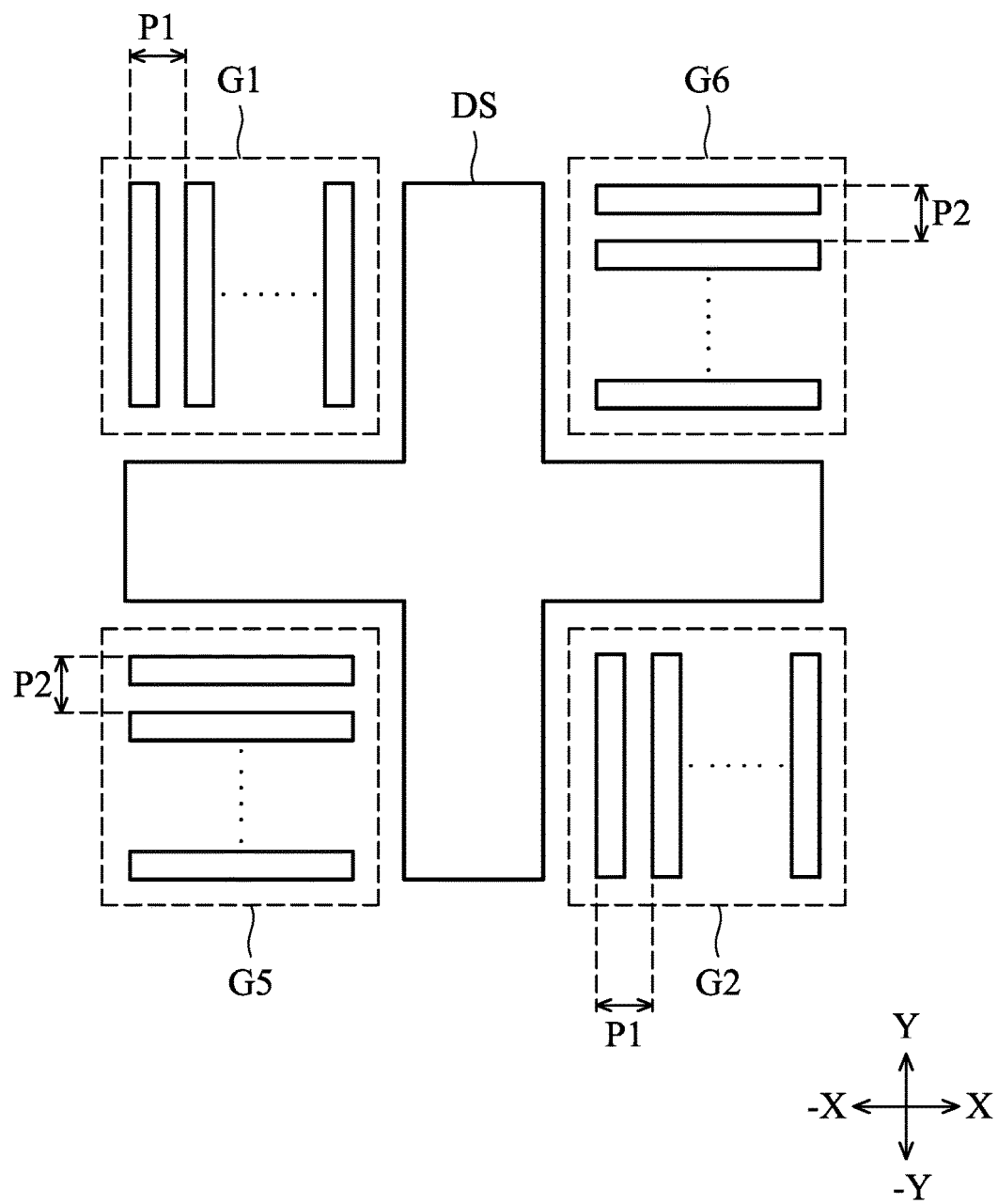

FIG. 7B shows metrology target 104 including the dummy structure DS in accordance with some embodiments. The metrology target 104 includes overlay targets OT1-OT4 as shown in FIGS. 2A-2C. FIG. 7B shows the components of the metrology target 104 in layer m1 for the purpose of clarity.

As shown in FIG. 7B, the dummy structure DS is extended along the directions Y and −Y to separate the gratings G1 and G2 and extended along the directions X and −X to separate the gratings G5 and G6. In this embodiment, the dummy structure is not formed based on a spatial period and is formed by a single dummy component, which makes the brightness of the image data corresponding to the dummy structure DS different from the brightness of the image data corresponding to the overlay targets OT1-OT4 of the metrology target 104 (wherein the image data is generated by the light detection circuit 105). Accordingly, the processor 106 can distinguish the image data corresponding to the dummy structure DS and the image data corresponding to the overlay targets OT1-OT4 of the metrology target 104 and analyze the image data corresponding to the overlay targets OT1-OT4 of the metrology target 104 correctly.

Figure 7C:
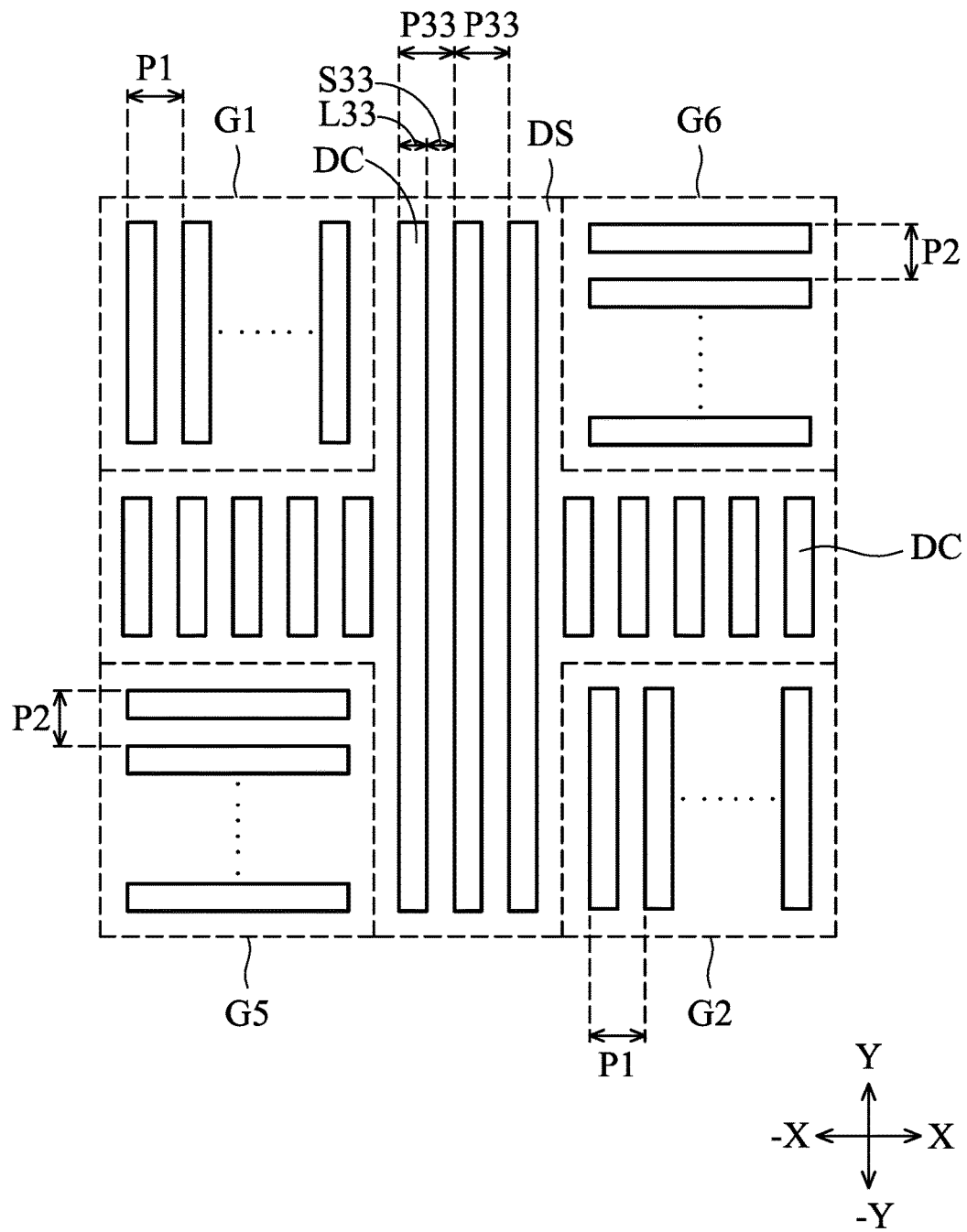

FIG. 7C shows the metrology target 104 including the dummy structure DS in accordance with some embodiments. The difference between the metrology target 104 in FIG. 7A and the metrology target 104 in FIG. 7C is the dummy structure DS.

As shown in FIG. 7C, the dummy structure DS includes multiple dummy components DC which are periodically placed along the direction X. In the direction X, the dummy components DC are arranged to repeat with the spatial period P33 which are the sum of the length L33 (which is the side length of one dummy component DC) and length S33 (which is the space between two adjacent dummy components DC).

In some embodiments, the spatial period P33 is less than the spatial period P1 to avoid the dummy components DC affecting the results of the DBO measurement performed based on the overlay targets OT1 and OT2. In some embodiments, the spatial period P33 is represented as $$P33 < P1 \times \frac{\lambda_{x,min}}{NA_{max}}.$$

Based on equation (3), the spatial period P33 is further represented by equation (9).

$$P33 < P1 \times \frac{NA_{min}}{NA_{max}} \quad (9)$$

In some embodiments, the spatial period P33 is less than the minimum workable wavelength ($\lambda_{x,\,min}$) corresponding to the overlay targets OT1 and OT2 of the metrology target 104.

In some embodiments, the spatial period P33 is greater than the spatial period P2 to avoid the dummy components DC affecting the results of the DBO measurement performed based on the overlay targets OT1 and OT2. In some embodiments, the spatial period P33 is represented as $$P33 > P1 \times \frac{\lambda_{x,max}}{NA_{min}}.$$

Based on equation (3), the spatial period P33 is further represented by equation (10).

$$P33 > P1 \times \frac{NA_{max}}{NA_{min}} \quad (10)$$

In some embodiments, the spatial period P33 is greater than the maximum workable wavelength ($\lambda_{x,\,max}$) corresponding to the overlay targets OT1 and OT2 of the metrology target 104.

As shown in FIG. 7C, in directions Y and −Y, the dummy components DC are extended along the directions Y and −Y and are not arranged to repeat with a spatial period, which makes the brightness of the image data corresponding to the dummy structure DS different from the brightness of the image data corresponding to the overlay targets OT3 and OT4 of the metrology target 104 (wherein the image data is generated by the light detection circuit 105). Accordingly, the processor 106 can distinguish the image data corresponding to the dummy structure DS and the image data corresponding to the overlay targets OT3 and OT4 of the metrology target 104 and analyze the image data corresponding to the overlay targets OT3 and OT4 of the metrology target 104 correctly.

Figure 7D:
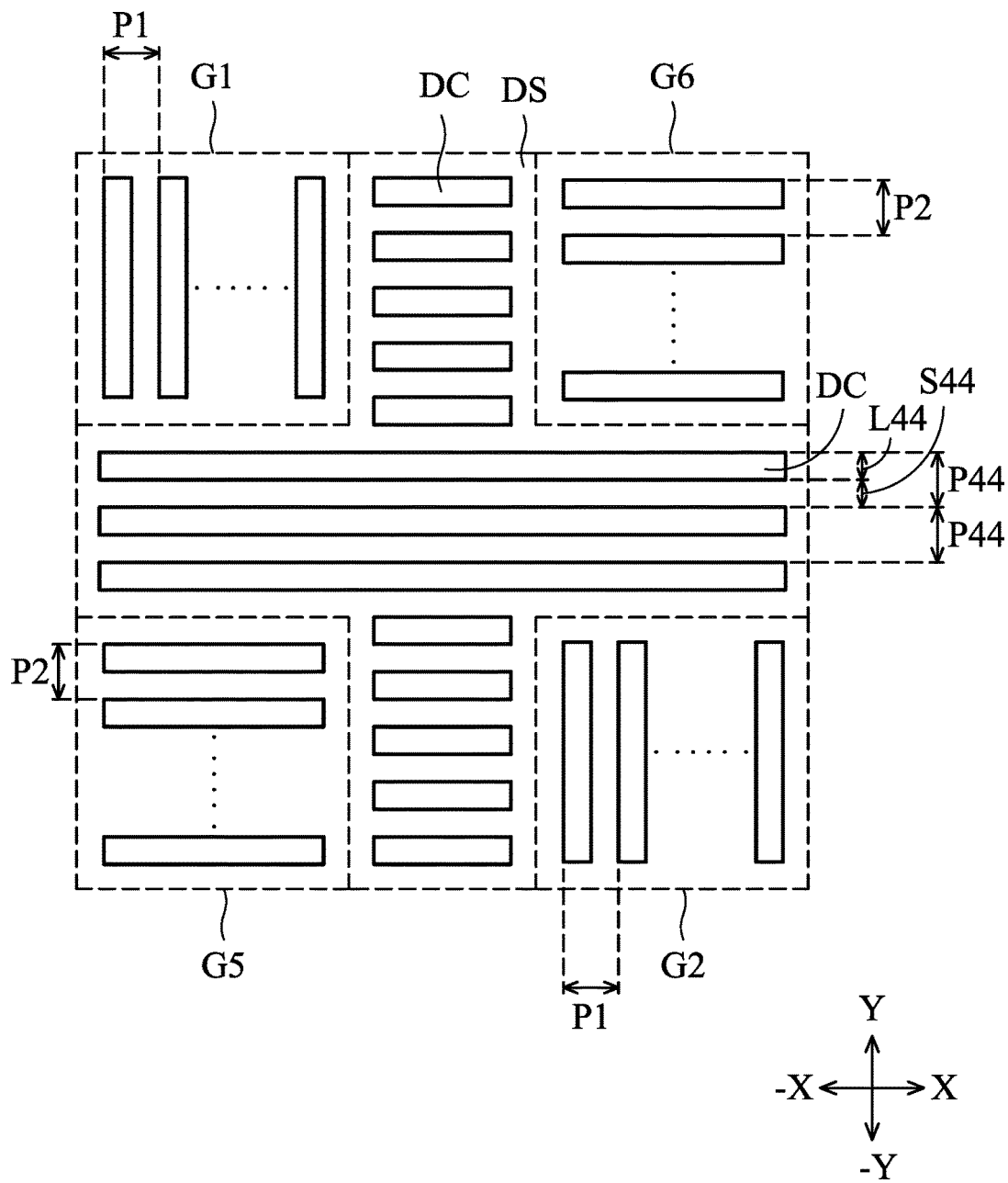

In some embodiments, the dummy components DC in FIG. 7C can be modified to be periodically placed along the direction Y and extended along the directions X and −X, as shown in FIG. 7D.

As shown in FIG. 7D, multiple dummy components DC of the dummy structure DS are periodically formed along the direction Y. In the direction Y, the dummy components DC are arranged to repeat with the spatial period P44 which are the sum of the length L44 (which is the side length of one dummy component DC) and length S44 (which is the space between two adjacent dummy components DC).

In some embodiments, the spatial period P44 is less than the spatial period P2 to avoid the dummy components DC affecting the results of the DBO measurement performed based on the overlay targets OT3 and OT4. In some embodiments, the spatial period P44 is represented as $$P44 > P2 \times \frac{\lambda_{y,max}}{NA_{min}}.$$

Based on equation (6), the spatial period P44 is further represented by equation (11).

$$P44 < P2 \times \frac{NA_{min}}{NA_{max}} \quad (11)$$

In some embodiments, the spatial period P44 is less than the minimum workable wavelength ($\lambda_{y,\,min}$) corresponding to the overlay targets OT3 and OT4 of the metrology target 104.

In some embodiments, the spatial period P44 is greater than the spatial period P2 to avoid the dummy components DC affecting the results of the DBO measurement performed based on the overlay targets OT3 and OT4. In some embodiments, the spatial period P44 is represented as $$P44 > P2 \times \frac{\lambda_{y,max}}{NA_{min}}.$$

Based on equation (6), the spatial period P44 is further represented by equation (12).

$$P44 > P2 \times \frac{NA_{max}}{NA_{min}} \quad (12)$$

In some embodiments, the spatial period P44 is greater than the maximum workable wavelength ($\lambda_{y,\,max}$) corresponding to the overlay targets OT3 and OT4 of the metrology target 104.

As shown in FIG. 7D, in directions X and −X, the dummy components DC are extended along the directions X and −X and are not arranged to repeat with a spatial period, which makes the brightness of the image data corresponding to the dummy structure DS different from the brightness of the image data corresponding to the overlay targets OT3 and OT4 of the metrology target 104 (wherein the image data is generated by the light detection circuit 105). Accordingly, the processor 106 can distinguish the image data corresponding to the dummy structure DS and the image data corresponding to the overlay targets OT3 and OT4 of the metrology target 104 and analyze the image data corresponding to the overlay targets OT3 and OT4 of the metrology target 104 correctly.

Figure 8A:
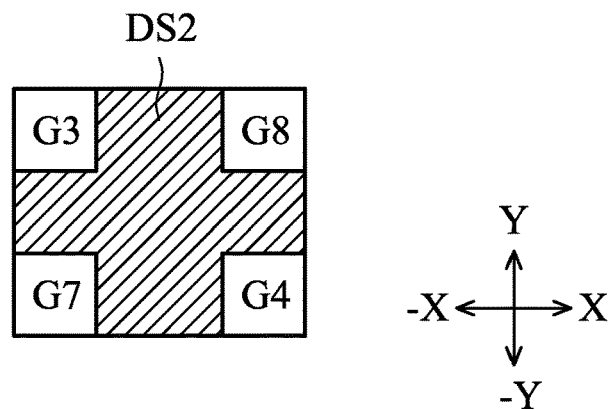
FIGS. 8A-8D show metrology targets which respectively include a dummy structure in accordance with some embodiments.

In some embodiments, dummy structures can be formed in both layer m1 and layer m2. Referring to FIG. 8A, the dummy structure DS2 is formed between each grating in the layer m2 of the metrology target 104, and the material of the dummy structure DS2 is the same as the gratings G3, G4, G7, and G8. In some embodiments, the layer m2 can be metal.

Figure 8B:
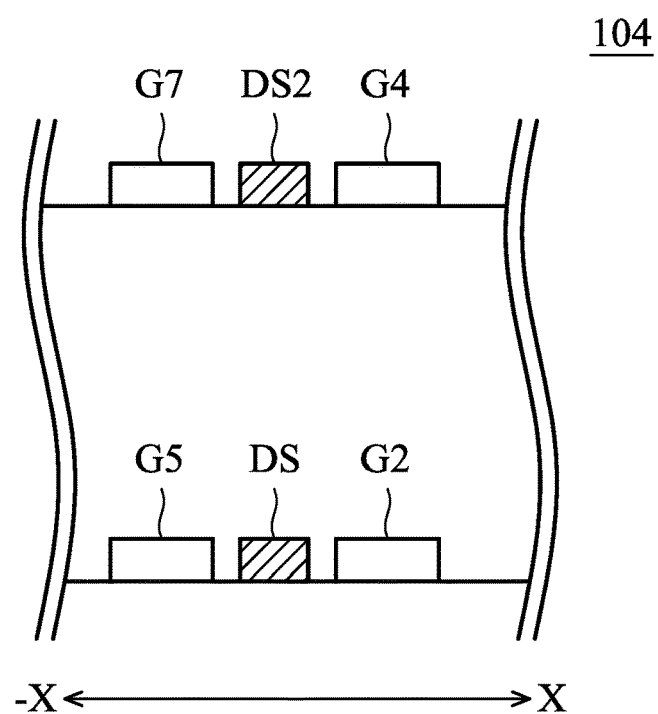
Figure 8C:
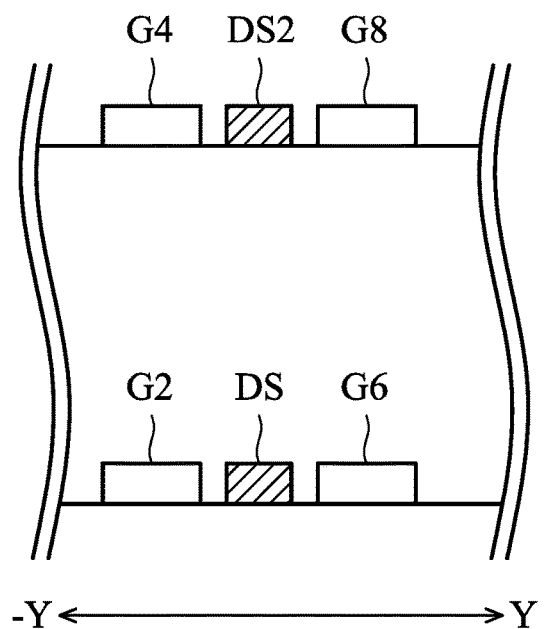

FIGS. 8B and 8C show the cross-sectional diagram of the metrology target 104 including the dummy structures DS and DS2 in accordance with some embodiments. Compared with the embodiments described in FIGS. 4B-4C, FIGS. 8B and 8C show that the metrology target 104 further has the dummy structure DS2 in the layer m2. In such cases, the dishing effect on the structures formed over the metrology target 104 can be improved, and the metrology targets formed over the metrology target 104 can be fabricated properly.

Figure 8D:
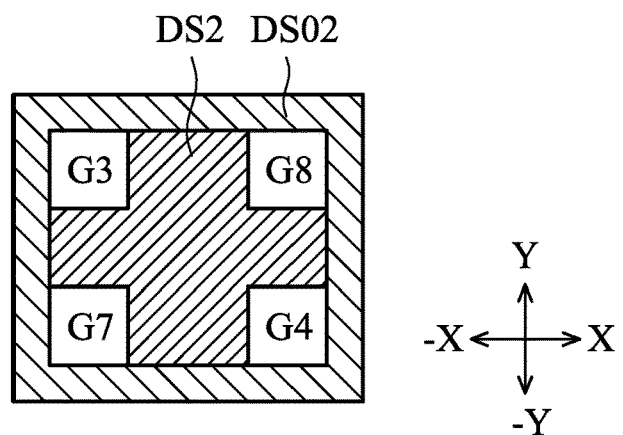

In some embodiments, each grating in layer m2 of the metrology target 104 is surrounded by dummy components. As shown in FIG. 8D, the gratings G3, G4, G7, and G8 are respectively surrounded by the dummy components of the dummy structures DS2 and DSO2 to reduce the difference in component density between the metrology target 104 and the patterns formed around the metrology target 104 in layer m2.

Refer to the aforementioned embodiments which respectively correspond to the equations (3)-(12): the dummy structure DS2 can be formed based on the spatial period of the gratings G3, G4, G7, and G8. In some embodiments, the dummy structure DS2 in FIGS. 8B and 8C can be formed as one of the dummy structures DS described in FIGS. 6A, 6B, 7A, 7B, 7C, and 7D. In some embodiments, the dummy structure DS and the dummy structure DS2 are formed identically. In some embodiments, the dummy structure DS and the dummy structure DS2 are formed differently.

Figure 9A:
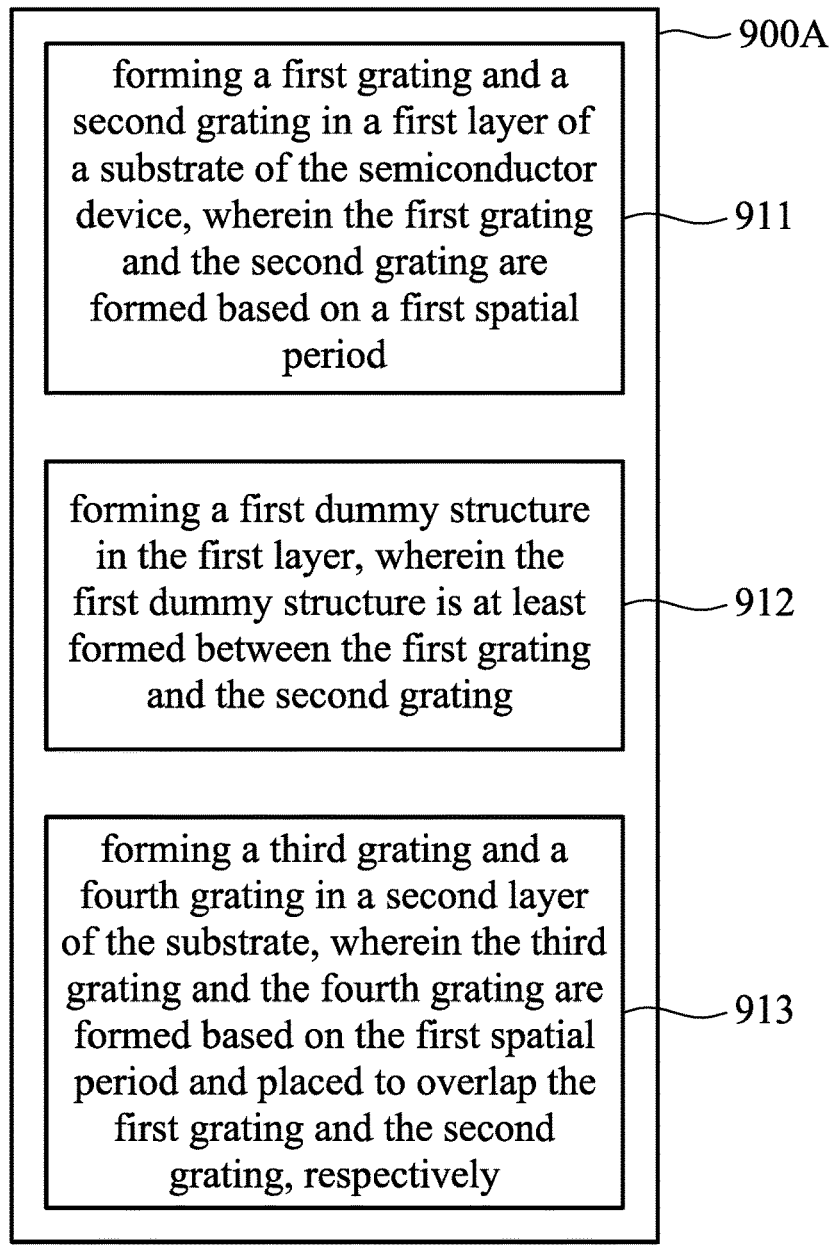
FIGS. 9A-9B illustrate a manufacturing method of a metrology target of a semiconductor device.

FIG. 9A illustrates a manufacturing method 900A of a metrology target (e.g., metrology target 104) of a semiconductor device (e.g., semiconductor device 103).

In operation 911, a first grating (e.g., grating G1) and a second grating (e.g., grating G2) are formed in a first layer (e.g., layer m1) of a substrate of the semiconductor device (e.g., semiconductor device 103), wherein the first grating and the second grating are formed based on a first spatial period (e.g., spatial period P1).

In operation 912, a first dummy structure (e.g., dummy structure DS) is formed in the first layer, wherein the first dummy structure is at least formed between the first grating and the second grating.

In operation 913, a third grating (e.g., grating G3) and a fourth grating (e.g., grating G4) are formed in a second layer (e.g., layer m2) of the substrate, wherein the third grating and the fourth grating are formed based on the first spatial period and placed to overlap the first grating and the second grating, respectively.

In some embodiments, the second layer is formed over the first layer. The first grating and the third grating are formed with a first positional offset (e.g., positional offset d1) which is along a first direction (e.g., direction X). The second grating and the fourth grating are formed with a second positional offset (e.g., positional offset d1') which is along a second direction (e.g., direction −X). The first direction is opposite to the second direction.

Figure 9B:
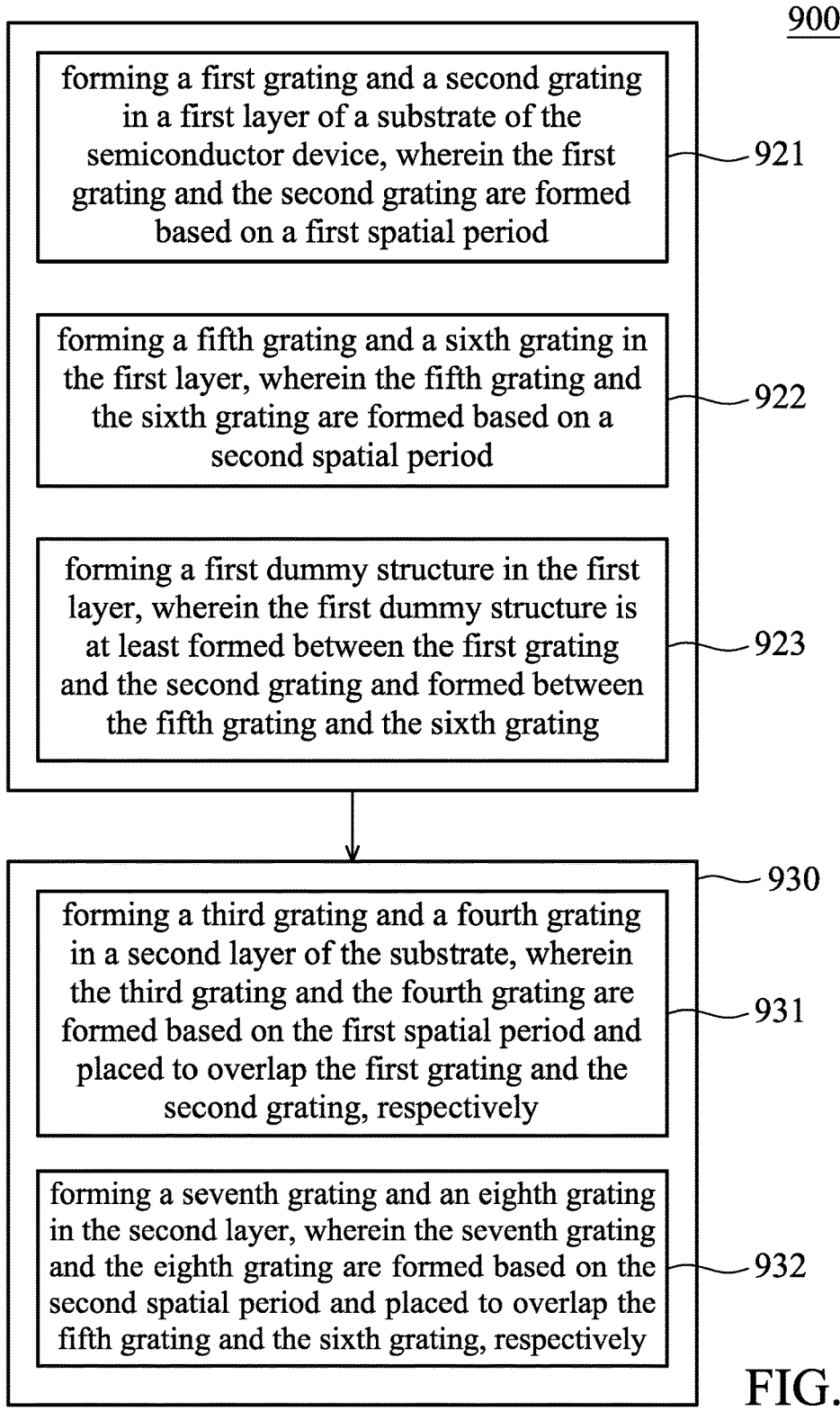

FIG. 9B shows simplified flowcharts illustrating a manufacturing method 900B of a metrology target (e.g., metrology target 104) of a semiconductor device (e.g., semiconductor device 103). The manufacturing method 900B includes operations 920 and 930. The operation 920 includes operations 921-923, and the operation 930 includes operations 931-932.

In operation 921, a first grating (e.g., grating G1) and a second grating (e.g., grating G2) are formed in a first layer (e.g., layer m1) of a substrate of the semiconductor device (e.g., semiconductor device 103), wherein the first grating and the second grating are formed based on a first spatial period (e.g., spatial period P1).

In operation 922, a fifth grating (e.g., grating G5) and a sixth grating (e.g., grating G6) are formed in the first layer, wherein the fifth grating and the sixth grating are formed based on a second spatial period (e.g., spatial period P2).

In operation 923, a first dummy structure (e.g., dummy structure DS) is formed in the first layer, wherein the first dummy structure is at least formed between the first grating and the second grating and formed between the fifth grating and the sixth grating.

In operation 931, a third grating (e.g., grating G3) and a fourth grating (e.g., grating G4) are formed in a second layer (e.g., layer m2) of the substrate, wherein the third grating and the fourth grating are formed based on the first spatial period and placed to overlap the first grating and the second grating, respectively.

In operation 932, a seventh grating (e.g., grating G7) and an eighth grating (e.g., grating G8) are formed in the second layer, wherein the seventh grating and the eighth grating are formed based on the second spatial period and placed to overlap the fifth grating and the sixth grating, respectively.

In some embodiments, the second layer is formed over the first layer. The first grating and the third grating are formed with a first positional offset (e.g., positional offset d1) which is along a first direction (e.g., direction X). The second grating and the fourth grating are formed with a second positional offset (e.g., positional offset d1') which is along a second direction (e.g., direction −X). The first direction is opposite to the second direction. The fifth grating and the seventh grating are formed with a third positional offset (e.g., positional offset d2) which is along a third direction (e.g., direction Y). The sixth grating and the eighth grating are formed with a fourth positional offset (e.g., positional offset d2') which is along a fourth direction (e.g., direction −Y). The third direction is opposite to the fourth direction, and the third direction is perpendicular to the first direction.

The metrology targets (e.g. metrology target 104) having a dummy structure (e.g. the dummy structure DS) are provided. The metrology target having a dummy structure can reduce the dishing effect and improve the accuracy of the DBO measurement. Since the accuracy of the DBO measurement is improved, the yield in manufacturing the semiconductor device (e.g., semiconductor device 103) is also improved. Therefore, the efficiency of fabricating the semiconductor device is improved, and the cost of the semiconductor-manufacturing process can be reduced.

In some embodiments, a metrology target of a semiconductor device is provided. The metrology target includes a substrate. The substrate includes a first layer and a second layer. The first layer includes a first grating, a second grating, and a first dummy structure. The first grating is formed based on a first spatial period. The second grating is formed based on the first spatial period. The first dummy structure is at least formed between the first grating and the second grating. The second layer is formed over the first layer and includes a third grating and a fourth grating. The third grating is formed based on the first spatial period and placed to overlap the first grating. The fourth grating is formed based on the first spatial period and placed to overlap the second grating. The first grating and the third grating are formed with a first positional offset which is along a first direction. The second grating and the fourth grating are formed with a second positional offset which is along a second direction. The first direction is opposite to the second direction.

In some embodiments, a metrology target of a semiconductor device is provided. The metrology target includes a substrate which includes a first layer and a second layer. The first layer includes a first grating, a second grating, and a first dummy structure. The first grating is formed based on a first spatial period. The second grating is formed based on the first spatial period. The first dummy structure is at least formed between the first grating and the second grating. The second layer is formed over the first layer and includes a third grating, a fourth grating, and a second dummy structure. The third grating is formed based on the first spatial period and placed to overlap the first grating. The fourth grating is formed based on the first spatial period and placed to overlap the second grating. The second dummy structure is at least formed between the third grating and the fourth grating. The first grating and the third grating are formed with a first positional offset which is along a first direction. The second grating and the fourth grating are formed with a second positional offset which is along a second direction. The first direction is opposite to the second direction.

In some embodiments, a manufacturing method of a metrology target of a semiconductor device is provided. A first grating and a second grating in a first layer of a substrate of the semiconductor device are formed, wherein the first grating and the second grating are formed based on a first spatial period. A first dummy structure in the first layer is formed, wherein the first dummy structure is at least formed between the first grating and the second grating. A third grating and a fourth grating in a second layer of the substrate are formed, wherein the third grating and the fourth grating are formed based on the first spatial period and placed to overlap the first grating and the second grating, respectively. The second layer is formed over the first layer. The first grating and the third grating are formed with a first positional offset which is along a first direction. The second grating and the fourth grating are formed with a second positional offset which is along a second direction. The first direction is opposite to the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metrology target of a semiconductor device, comprising:
    a substrate;
    a first layer formed over the substrate, comprising:
    a first grating, formed based on a first spatial period; and
    a second grating, formed based on the first spatial period;
    a second layer formed over the first layer, comprising:
    a third grating, formed based on the first spatial period and placed to overlap the first grating; and
    a fourth grating, formed based on the first spatial period and placed to overlap the second grating; and
    a single dummy structure, formed in the first layer and between the first grating and the second grating;
    wherein the first grating and the third grating are formed with a first positional offset which is along a first direction;
    wherein the second grating and the fourth grating are formed with a second positional offset which is along a second direction;
    wherein the first direction is opposite to the second direction.

2. The metrology target as claimed in claim 1, wherein the single dummy structure comprises a plurality of dummy components which are formed based on a second spatial period;
    wherein the second spatial period and the first spatial period are different.

3. The metrology target as claimed in claim 1, wherein the single dummy structure comprises a dummy component;
    wherein the dummy component is extended along a third direction and a fourth direction to separate the first grating from the second grating;
    wherein the third direction is opposite to the fourth direction, and the third direction is perpendicular to the first direction.

4. The metrology target as claimed in claim 1, wherein the single dummy structure comprises a plurality of dummy components;
   wherein the first grating is surrounded by the dummy components, and the second grating is surrounded by the dummy components;
   wherein the first grating and the second grating are separated by the dummy components.

5. The metrology target as claimed in claim 1, wherein the first layer further comprises:
   a fifth grating, formed based on a second spatial period; and
   a sixth grating, formed based on the second spatial period;
   wherein the second layer further comprises:
   a seventh grating, formed based on the second spatial period and placed to overlap the fifth grating; and
   an eighth grating, formed based on the second spatial period and placed to overlap the sixth grating;
   wherein the single dummy structure is at least formed between the first grating and the second grating and formed between the fifth grating and the sixth grating;
   wherein the fifth grating and the seventh grating are formed with a third positional offset which is along a third direction;
   wherein the sixth grating and the eighth grating are formed with a fourth positional offset which is along a fourth direction;
   wherein the third direction is opposite to the fourth direction, and the third direction is perpendicular to the first direction.

6. The metrology target as claimed in claim 5, wherein the single dummy structure comprises a plurality of dummy components which are formed based on a third spatial period;
   wherein the third spatial period is different from the first spatial period, and the third spatial period is different from the second spatial period.

7. The metrology target as claimed in claim 5, wherein the single dummy structure comprises a dummy component;
   wherein the dummy component is extended along the third direction and the fourth direction to separate the first grating from the second grating;
   wherein the dummy component is extended along the first direction and the second direction to separate the fifth grating from the sixth grating.

8. The metrology target as claimed in claim 5, wherein the single dummy structure comprises a plurality of dummy components;
   wherein the first grating is surrounded by the dummy components, and the second grating is surrounded by the dummy components;
   wherein the fifth grating is surrounded by the dummy components, and the sixth grating is surrounded by the dummy components;
   wherein the first grating and the second grating are separated by the dummy components, and the fifth grating and the sixth grating are separated by the dummy components.

9. A metrology target of a semiconductor device, comprising:
   a substrate, comprising:
   a first layer, comprising:
   a first grating, formed based on a first spatial period;
   a second grating, formed based on the first spatial period; and
   a first dummy structure, at least formed between the first grating and the second grating, and comprising a plurality of first dummy components which are formed based on a second spatial period; and
   a second layer formed over the first layer, comprising:
   a third grating, formed based on the first spatial period and placed to overlap the first grating;
   a fourth grating, formed based on the first spatial period and placed to overlap the second grating; and
   a second dummy structure, at least formed between the third grating and the fourth grating;
   wherein the first grating and the third grating are formed with a first positional offset which is along a first direction;
   wherein the second grating and the fourth grating are formed with a second positional offset which is along a second direction;
   wherein the first direction is opposite to the second direction wherein the second spatial period is greater than the first spatial period.

10. The metrology target as claimed in claim 9,
    wherein the second dummy structure comprises a plurality of second dummy components which are formed based on a third spatial period;
    wherein the third spatial period is different from the first spatial period.

11. The metrology target as claimed in claim 10,
    wherein the third spatial period is less than the first spatial period.

12. The metrology target as claimed in claim 10,
    wherein the third spatial period is greater than the first spatial period or the third spatial period is equal to the second spatial period.

13. The metrology target as claimed in claim 9,
    wherein the first grating is surrounded by the first dummy components, and the second grating is surrounded by the first dummy components;
    wherein the first grating and the second grating are separated by the first dummy components;
    wherein the second dummy structure comprises a plurality of second dummy components;
    wherein the third grating is surrounded by the second dummy components, and the fourth grating is surrounded by the second dummy components;
    wherein the third grating and the fourth grating are separated by the second dummy components.

14. The metrology target as claimed in claim 9, wherein the first layer further comprises:
    a fifth grating, formed based on a third spatial period; and
    a sixth grating, formed based on the third spatial period;
    wherein the second layer further comprises:
    a seventh grating, formed based on the third spatial period and placed to overlap the fifth grating; and
    an eighth grating, formed based on the third spatial period and placed to overlap the sixth grating;
    wherein the first dummy structure is at least formed between the first grating and the second grating and formed between the fifth grating and the sixth grating;
    wherein the second dummy structure is at least formed between the third grating and the fourth grating and formed between the seventh grating and the eighth grating;
    wherein the fifth grating and the seventh grating are formed with a third positional offset which is along a third direction;
    wherein the sixth grating and the eighth grating are formed with a fourth positional offset which is along a fourth direction;

wherein the third direction is opposite to the fourth direction, and the third direction is perpendicular to the first direction.

15. The metrology target as claimed in claim 14, wherein the second dummy structure comprises a plurality of second dummy components which are formed based on a fourth spatial period;
wherein the third spatial period is different from the second spatial period;
wherein the fourth spatial period is different from the first spatial period, and the fourth spatial period is different from the third spatial period.

16. The metrology target as claimed in claim 14, wherein the second spatial period is greater than the third spatial period or the third spatial period is equal to the first spatial period.

17. The metrology target as claimed in claim 14, wherein the first grating is surrounded by the first dummy components, and the second grating is surrounded by the first dummy components;
wherein the fifth grating is surrounded by the first dummy components, and the sixth grating is surrounded by the first dummy components;
wherein the first grating and the second grating are separated by the first dummy components, and the fifth grating and the sixth grating are separated by the first dummy components.

18. The metrology target as claimed in claim 17, wherein the second dummy structure comprises a plurality of second dummy components;
wherein the third grating is surrounded by the second dummy components, and the fourth grating is surrounded by the second dummy components;
wherein the seventh grating is surrounded by the second dummy components, and the eighth grating is surrounded by the second dummy components;
wherein the third grating and the fourth grating are separated by the second dummy components, and the seventh grating and the eighth grating are separated by the second dummy components.

19. A manufacturing method of a metrology target of a semiconductor device, comprising:
forming a first grating and a second grating in a first layer over a substrate in the metrology target, wherein the first grating and the second grating are formed based on a first spatial period;
forming a first dummy structure in the first layer, wherein the first dummy structure is at least formed between the first grating and the second grating; and
forming a third grating and a fourth grating in a second layer over the substrate, wherein the third grating and the fourth grating are formed based on the first spatial period and placed to overlap the first grating and the second grating, respectively;
wherein the second layer is formed over the first layer;
wherein the first grating and the third grating are formed with a first positional offset which is along a first direction;
wherein the second grating and the fourth grating are formed with a second positional offset which is along a second direction;
wherein the first direction is opposite to the second direction;
wherein no dummy structure is formed in the second layer of the metrology target.

20. The manufacturing method as claimed in claim 19, further comprising:
forming a fifth grating and a sixth grating in the first layer, wherein the fifth grating and the sixth grating are formed based on a second spatial period; and
forming a seventh grating and an eighth grating in the second layer, wherein the seventh grating and the eighth grating are formed based on the second spatial period and placed to overlap the fifth grating and the sixth grating, respectively;
wherein the first dummy structure is at least formed between the first grating and the second grating and formed between the fifth grating and the sixth grating;
wherein the fifth grating and the seventh grating are formed with a third positional offset which is along a third direction;
wherein the sixth grating and the eighth grating are formed with a fourth positional offset which is along a fourth direction;
wherein the third direction is opposite to the fourth direction, and the third direction is perpendicular to the first direction.

* * * * *